United States Patent
Lautzenhiser et al.

(10) Patent No.: US 6,922,106 B2
(45) Date of Patent: *Jul. 26, 2005

(54) DIVIDED-VOLTAGE FET POWER AMPLIFIERS

(75) Inventors: Barry Arthur Lautzenhiser, Carson City, NV (US); Lloyd Lynn Lautzenhiser, Sun Valley, NV (US)

(73) Assignee: Emhiser Research, Inc., Verdi, NV (US)

( * ) Notice: Subject to any disclaimer, the term of this patent is extended or adjusted under 35 U.S.C. 154(b) by 17 days.

This patent is subject to a terminal disclaimer.

(21) Appl. No.: 10/602,442

(22) Filed: Jun. 24, 2003

(65) Prior Publication Data

US 2003/0231061 A1 Dec. 18, 2003

Related U.S. Application Data

(63) Continuation of application No. 10/028,844, filed on Dec. 20, 2001, now Pat. No. 6,683,499.
(60) Provisional application No. 60/258,341, filed on Dec. 27, 2000.

(51) Int. Cl.[7] ............................................. H03F 3/68
(52) U.S. Cl. ....................................... 330/295; 330/286
(58) Field of Search ................................ 330/295, 286, 330/277, 124 R, 84

(56) References Cited

U.S. PATENT DOCUMENTS

| | | | | |
|---|---|---|---|---|
| 4,614,915 A | * | 9/1986 | Heston et al. | 330/277 |
| 4,631,493 A | * | 12/1986 | Vendelin et al. | 330/277 |
| 5,949,287 A | * | 9/1999 | Kurusu et al. | 330/277 |

* cited by examiner

*Primary Examiner*—Henry Choe
(74) *Attorney, Agent, or Firm*—Wendell E. Miller, Patent Agent

(57) ABSTRACT

Divided-voltage FET amplifiers (10, 20, 30, 40, 50, 60, 70, 80, 90, 100, 110, 130, 140, 150, 160, 170, 180, 200, or 220) include two or more solid-state current devices, preferably gallium arsenide FETs (Q1, Q2, Q4, Q5, Q6, and/or Q8), connected in series or series-parallel for dc operation, and connected in parallel for rf operation, thereby improving power efficiency by using the same current two or more times to develop rf power. Various ones of the embodiments produce separate rf outputs, separately amplify two rf outputs and subsequently combine them into a single rf output, and/or selectively phase shift rf outputs. Isolation between rf frequencies and dc voltages includes using decoupling capacitors with selected resonant frequencies and low effective series resistances (ESRs) and using inductors with selected self-resonant frequencies for rf chokes. Preferably, providing low ESRs includes paralleling two or more decoupling capacitors (Ca-n) with low ESRs, whose resonant frequencies can be distributed for wide-band operation.

25 Claims, 14 Drawing Sheets

DIVIDED-VOLTAGE FET POWER AMPLIFIERS

CROSS-REFERENCES TO RELATED APPLICATIONS

This patent application is a Continuation of U.S. patent application Ser. No. 10/028,844, filed Dec. 20, 2001 now U.S. Pat. No. 6,683,499 which claims priority to Provisional Patent Application Ser. No. 60/258,341, filed 27 Dec. 2000.

STATEMENT RE FEDERALLY SPONSORED RESEARCH OR DEVELOPMENT

Not Applicable

REFERENCE TO SEQUENCE LISTING

Not Applicable

BACKGROUND OF THE INVENTION

1. Field of the Invention

The present invention relates generally to apparatus and method for power amplifying radio frequency (rf) or microwave rf signals. More particularly, the present invention pertains to an rf power amplifier in which two or more field-effect devices with selectively chosen DC bias circuits and rf decoupling circuits dividingly share a supply voltage, and a single rf output, two or more rf outputs, or two or more variably phase shifted rf outputs are produced.

2. Description of the Related Art

Gallium arsenide field-effect transistors (GaAsFETs) are the primary solid state devices used for amplification of high frequency signals in the range of 3 Ghz and higher. GaAsFETs have the advantages of being readily available and relatively inexpensive. However, a major disadvantage of GaAsFETs is that the maximum operating voltage is commonly +10.0 volts dc.

For many transmitter/amplifier applications, particularly airborne applications, the dc supply voltage is 28 volts dc, plus or minus 4.0 volts dc. Since gallium arsenide FETs have an operative voltage of +10 volts dc, the use of gallium arsenide FETs has presented a problem.

Traditionally, there have been two solutions to this problem. One is to use a linear voltage regulator. The other is to use a switching regulator.

In linear voltage regulators, the voltage is linearly regulated from the supply of 28 volts to approximately 10 volts with the power difference being dissipated in heat by the regulator. This type of regulation has the disadvantages of excessive heat and low power efficiency.

Switching regulators, on the other hand, are power converters that transfer the power of a higher voltage supply to lower voltage with increased current capacity. This type of regulation has the advantage of low heat dissipation and high power efficiency, but has the disadvantages of increased costs, space inefficiency due to large size, and the creation of a spurious signal on the rf carrier (EMI problems) due to the switching action of the regulator. A high-attenuation filter is required to suppress this spurious switching signal.

A third approach to solving the problem of disparity between the operating voltage of solid-state devices and a source voltage has been to connect the solid-state devices in series, thereby dividingly sharing the source voltage and utilizing the same current flow two or more times. This third approach was presented in *IEEE Transactions on Microwave Theory and Techniques*, Volume 46, Number 12, of December 1998, in an article entitled, "A 44-Ghz High IP3 InP-HBT Amplifier with Practical Current Reuse Biasing."

This type of circuit solves the problem of the disparity between the operating voltage of solid-state devices and a higher supply voltage by stacking the solid-state devices in a totem pole fashion so that the source voltage is divided between the solid-state devices. Two, or more, solid-state devices are used in series for dc operation, but they are used in parallel for rf operation.

Thus, current that flows in series through the solid-state devices is used twice, or more times, in the production of the rf output. It is used once in each of two, or more, series-connected solid-state devices, thereby increasing the rf output for a given current flow, as compared to rf amplifiers connected in the conventional fashion.

However, totem-pole, voltage-dividing, or current-sharing circuits, have been used only at low rf powers, as in the above-referenced article wherein the power was in the order of 10 milliwatts. At higher rf powers, problems associated with inadequate rf decoupling have included low power efficiency, oscillation, a decrease in reliability of the circuits, and destruction of the solid-state devices.

In contrast, to the extremely low rf outputs in which the prior art has been able to utilize totem-pole circuitry, the present invention has been used with great success for rf outputs up to five Watts per solid-state device. However, this is not the limit, it is believed that the principles of the present invention may be used to make totem-pole circuits practical with solid-state devices with no apparent power limit.

In totem-pole circuits, problems with rf decoupling are most severe between the solid-state devices. In the present invention, the solid-state devices preferably are FETs. That is, when using FETs, rf decoupling is the most critical with regard to a source terminal of any FET that is connected to a drain terminal of a next-lower FET. Capacitors and rf chokes are used for rf decoupling and rf isolating, but selection and design of capacitor decoupling is the most critical.

The next most critical location for rf decoupling is the source terminal of the lower FET when the source terminal of the lower FET is connected to an electrical ground through a resistor, as shown herein. However, if a negative bias voltage is used for the gate of the lower FET, and the source is connected directly to an electrical ground, this source terminal is already rf decoupled. Again, capacitors are used for rf decoupling, and selection and design of capacitor decoupling is critical.

Other critical rf decoupling problems are those associated with the supply voltage to the drain of the upper FET and bias voltages to the gates of the FETs. The use of properly designed rf chokes are sufficient to provide adequate rf decoupling in these locations.

Unless rf decoupling is provided as taught herein, reduced efficiency will certainly occur, and both instability and destruction of the solid-state current devices are likely. More particularly, if one of the solid-state current devices goes into unstable self-oscillation, it will consume more dc bias and most likely become over biased resulting in destruction of the solid-state device.

In a totem-pole configuration that uses FETs, all FETs may be destroyed if one FET fails, depending on how the first FET fails. For example, if the upper FET oscillates and consumes the dc bias, it will be over biased and will be destroyed. If, in the destruction, the drain and source short circuit, which is a common type of failure, the lower FET will be over biased, too, so that the lower FET will fail also.

In short, inadequate rf decoupling, at the very least results in very low efficiency. At the worst, and with higher likelihood at higher rf outputs, it results in destruction of the FETs and/or damage or destruction of circuits connected to the FET inputs and outputs.

BRIEF SUMMARY OF THE INVENTION

In the present invention, two, or more, gallium arsenide field-effect transistors (GaAsFETs) are connected in series between positive and negative terminals of a supply voltage. Therefore, all of the series-connected FETs use the same current flow. And all of the series-connected FETs proportionally share, or dividingly share, the supply voltage between/among the FETs.

Alternately, two FETs that use less current are connected in parallel in a stack with two or more power-amplifying FETs to best utilize not only the supply voltage, but also the current required by the power-amplifying FETs.

More particularly, the FETs are stacked like a totem pole with the drain of a top, or upper, FET being operatively connected to a relatively high positive potential, a source terminal of the top FET being connected to a drain terminal of a lower FET, and a source terminal of the lower FET being connected to a lower voltage.

An rf power splitter is used to split the rf input two or more ways for the gates of the FETs. In various ones of the embodiments, an rf power combiner is connected to the drain terminals of the FETs to combine the rf outputs. Optionally, a power detector, conditioner, and an npn transistor are used in a feedback circuit to flatten the rf output with respect to frequency, voltage, temperature, and time.

The rf input, which optionally is generated by a voltage controlled oscillator (VCO), is inputted directly into the splitter, or is power amplified by a driver FET before being inputted into the splitter.

The negative gate-to-source bias for the lower FET controls current flow through all FETs, which in turn controls power amplification.

Various embodiments of the present invention control the gate-to-source bias of the lower FET in unique and useful ways, thereby providing unique and useful ways of controlling both current flow through the FETs and amplification of the rf power amplifier.

While in most of the embodiments a power combiner is used to combine the rf signals after being power amplified by the FETs, in other embodiments, the rf signals are used separately with or without variable phase shifting.

In still another embodiment, separate rf inputs, which may be at different frequencies, different levels, and different modulation types, are separately amplified, and then combined to produce both rf signals in a single rf output.

The design and selection of the dc bias, rf chokes, and rf decoupling capacitors are critical to the operation and performance of current-sharing rf amplifier circuits, particularly in high power rf applications.

Improperly designed dc bias circuits will result in a reduction of power efficiency, destruction of one or more amplifying FETs, or decrease the reliability of the solid-state devices, especially at all but the lowest rf powers.

For maximum power efficiency, rf chokes must be chosen to prevent coupling of the rf signal onto the dc power lines and to obtain maximum isolation between the series FETs, and thereby to prevent rf crosstalk.

Conventionally, rf power amplifying FETs are biased with a negative dc voltage applied to the gate terminal, a positive power supply dc voltage applied to the drain terminal, and the source terminal attached to a circuit ground. However, as shown and taught herein, preferably, the source terminal of the lower FET is connected to an electrical ground through a resistor, thereby causing the FET to self bias and eliminating the need for a negative voltage for the gate terminal.

As taught herein, selectively-chosen rf decoupling capacitor(s) that are attached to the source terminals of the FETs result in minimal rf impedance to a circuit ground, thereby achieving maximum power efficiency. That is, except for very low rf outputs, proper rf decoupling of source terminals of FETs, and similar terminals for other types of solid-state current devices, requires two things: one is that the decoupling capacitors must have self-resonant frequencies that match the output frequency, the other is that the effective series resistances (ESRs) of the decoupling capacitors must be extremely low, usually lower than is available even in porcelain capacitors. Therefore, in the present invention, two or more decoupling capacitors are paralleled, thereby reducing the ESR.

In addition, in designs in which the source terminal is the mounting flange of a packaged FET, as is common in high-power rf devices, the present invention provides a mounting technique that avoids both overheating and the resultant danger of destroying the internal junctions of the solid-state device, while maintaining electrical isolation from a circuit ground.

In a first aspect of the present invention, a method for rf power amplifying comprises: series connecting upper and lower solid-state current devices; the series connecting step comprises connecting a lower-voltage terminal of the upper solid-state current device to an rf choke, and connecting the rf choke to a higher-voltage terminal of the lower solid-state current device; separately amplifying rf signals in the solid-state current devices at a selected operating frequency; rf decoupling the solid-state current devices; the rf decoupling step comprises providing a capacitance between the lower-voltage terminal and an electrical ground; and the rf decoupling step further comprises making an rf effective series resistance of the capacitance lower than that of any porcelain capacitor that resonates at the selected operating frequency.

DETAILED DESCRIPTION OF THE INVENTION

Figure 1:
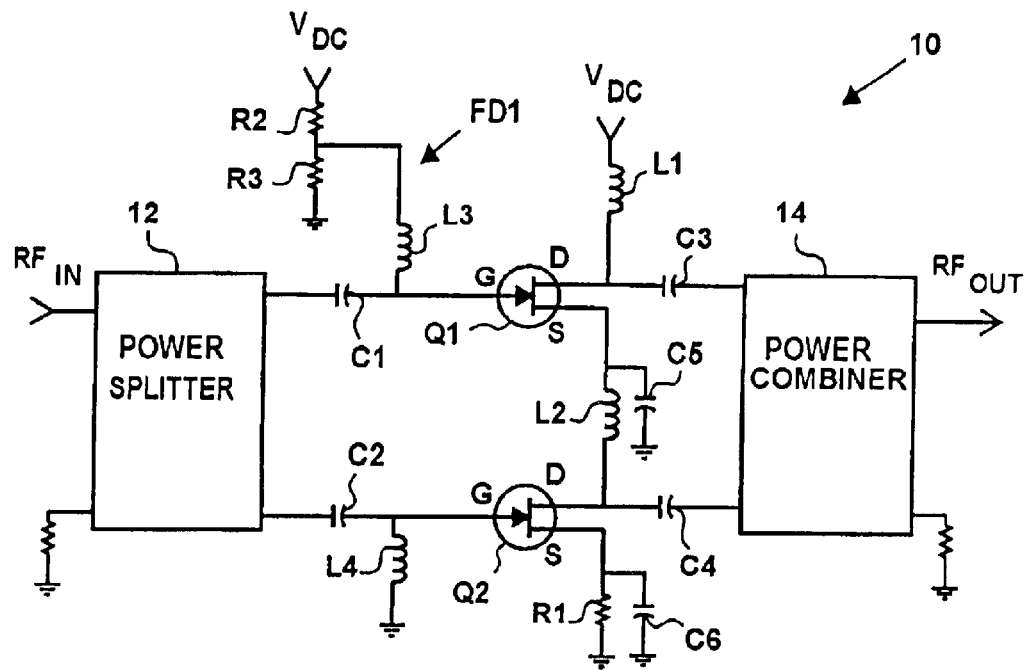
FIG. 1 is an rf power amplifier of the present invention comprising two, n-channel, gallium arsenide FETs that are stacked to proportionately share, or dividingly share, the supply voltage, an rf splitter, and an rf combiner.

Referring now to FIG. 1, an rf power amplifier 10 includes solid-state current devices, n-channel gallium arsenide field-effect transistors, GaAsFETs, or FETs, Q1 and Q2 that are connected in series between a positive supply voltage $V_{DC}$ and a ground.

More particularly, a first rf choke L1 connects the supply voltage $V_{DC}$ to a drain terminal of the FET Q1, a second rf choke L2 connects a source terminal of the FET Q1 to a drain terminal of the FET Q2, and a resistor R1 connects a source terminal of the FET Q2 to a ground.

The rf power amplifier 10 also includes an rf power splitter 12 and an rf power combiner 14. The rf power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to an electrical ground by decoupling capacitors C5 and C6, respectively.

A fixed voltage divider FD1, that includes resistors R2 and R3, is connected to the supply voltage $V_{DC}$, and supplies a bias voltage to the gate terminal of the FET Q1 through a third rf choke L3. The resistor R1 supplies a negative gate-to-source bias for the gate terminal of the FET Q2 through a fourth rf choke L4.

The resistor R1, in setting the gate-to-source bias for the FET Q2, controls current flow through both FETS, Q1 and Q2. It is important to remember this fact, since other embodiments of the present invention use various means for controlling the gate-to-source bias for the FET Q2, thereby providing means for controlling power amplification of the rf power amplifier 10.

Continuing to refer to FIG. 1, if the supply voltage is 22.0 volts dc, and if the resistor R1 provides a 2.0 voltage drop between the source terminal of the FET Q2 and a ground, assuming equal current through the FETS, Q1 and Q2, the remaining 20.0 volts will be equally divided, thereby providing 10.0 volts for each FET, Q1 and Q2, with the FET Q2 having 22.0 volts applied to the drain and 12.0 volts applied to the source terminal.

If then, resistances of the resistors R2 and R3 are proportioned to provide 10.0 volts to the gate terminal of the FET Q1, a negative gate-to-source bias of 2.0 volts will be provided for the FET Q1. In like manner, with 12.0 volts being applied to the drain terminal of the FET Q2 and 2.0 volts being applied to the source terminal, an electrical ground will be 2.0 volts below the voltage that is applied to the source terminal, thereby providing a negative gate-to-source bias of 2.0 volts for the FET Q2, since the gate terminal of the FET Q2 is connected to an electrical ground through the rf choke L4.

In operation, an input signal at an rf input $RF_{IN}$ is split in the rf power splitter 12, amplified in the FETs Q1 and Q2, and combined in the rf power combiner 14 to provide a power amplified output at an rf output $RF_{OUT}$.

The amplification function of the FETs Q1 and Q2 is maintained by using rf chokes, L1, L2, L3, and L4, to keep the rf signal from coupling onto the dc bias lines and to prevent rf interference between FETs Q1 and Q2; and decoupling capacitors, C5 and C6, are used to keep the source terminals of both FETS, Q1 and Q2, at an rf ground.

Since the performance of the rf power amplifier 10 rests heavily on correct design and application of the rf chokes, L1, L2, L3, and L4, and the decoupling capacitors, C5 and C6, their design and selection will be considered in greater detail after considering various other embodiments of the present invention.

Figure 1A:
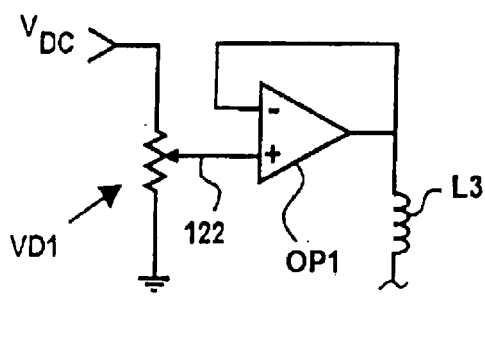
FIG. 1A replaces the fixed voltage divider of FIG. 1 with a potentiometer and adds a buffer for the gate-to-source bias.

Referring now to FIG. 1A, the voltage divider FD1, that includes the resistors R2 and R3, has been replaced by a variable voltage divider, or potentiometer, VD1. And an operational amplifier, OP1, configured as a buffer, has been inserted in series with the rf choke L3. Preferably, the potentiometer VD1 and the operational amplifier OP1 are used in all of the embodiments of the present invention.

Referring now to FIGS. 1 and 1A, with regard to the potentiometer VD1 of FIG. 1A, if any drain-to-source bias imbalances occur between the FETs, Q1 and Q2, when applying an rf signal, the drain-to-source biases of the FETs Q1 and Q2 may be equalized by adjusting a wiper 122 of the potentiometer VD1, thereby adjusting the gate-to-source bias of both FETs, Q1 and Q2.

Continuing to refer to FIGS. 1 and 1A, with regard to the operational amplifier OP1, the gate current of the FET Q1 must be accounted for when biasing the gate, particularly in high-power rf applications. If the gate current changes when the amplifier is tuned across a frequency band or operated over varying environmental conditions, the operational amplifier OP1 may be inserted between the voltage divider and the gate of the FET Q1, as shown, to prevent the varying gate current from affecting the fixed voltage divider FD1 and therefore the bias of both FETs, Q1 and Q2. A buffer is required since the gate current may be bi-directional under the varying operating conditions.

Figure 2:
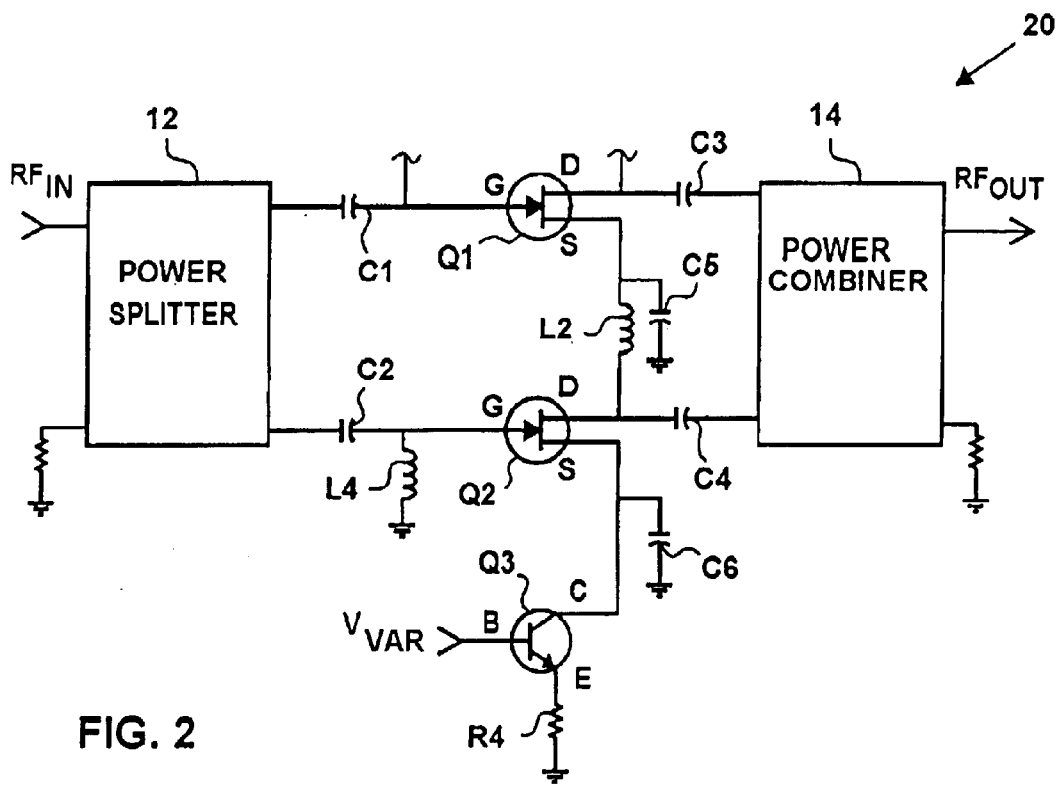
FIG. 2 is a variable rf power amplifier in which an npn bipolar transistor is stacked with the two FETs of FIG. 1 and replaces the source resistor of the lower FET, thereby providing current control of both FETs as a function of voltage applied to the base of the npn transistor.

Referring now to FIG. 2, an rf power amplifier, or variable rf power amplifier, 20 includes like-named and like-numbered components as those in FIG. 1, except that an npn bipolar transistor Q3 has been placed in series with the FETs Q1 and Q2, and the resistor R1 has been replaced by a resistor R4.

Further, although deleted from FIG. 2 and all subsequent FIGURES for the purpose of saving drawing space, the power amplifier 20 and all of the power amplifiers that will be described subsequently include: the rf choke L1, the rf choke L3, either the voltage divider FD1 of FIG. 1 or the voltage divider VD1 of FIG. 1A, and optionally, the operational amplifier OP1 of FIG. 1A.

Continuing to refer to FIG. 2, the npn bipolar transistor Q3 has been placed in the stack, in totem-pole arrangement, with the FETs Q1 and Q2, with a collector terminal of the npn bipolar transistor Q3 connected to the source terminal of the FET Q2, and with an emitter terminal of the transistor Q3 connected to the resistor R4. Thus, the npn bipolar transistor Q3 dividingly shares the supply voltage with the FETs Q1 and Q2, and thereby uses the same current, even as the FETs Q1 and Q2 of FIG. 1 dividingly share the supply voltage and use the same current.

Since GaAsFETs may be biased for linear amplification (Class A Amplifiers), or semilinear amplification, (Class B or A/B Amplifiers), amplification is approximately a linear function of the drain current. Therefore, by placing a variable current device, such as the transistor Q3, in series with the FET Q2, the rf power amplifier 10 of FIG. 1 becomes the variable rf power amplifier 20 of FIG. 2. Power amplification is variably controlled by controlling a voltage $V_{VAR}$ to a base terminal of the npn bipolar transistor Q3.

Figure 3:
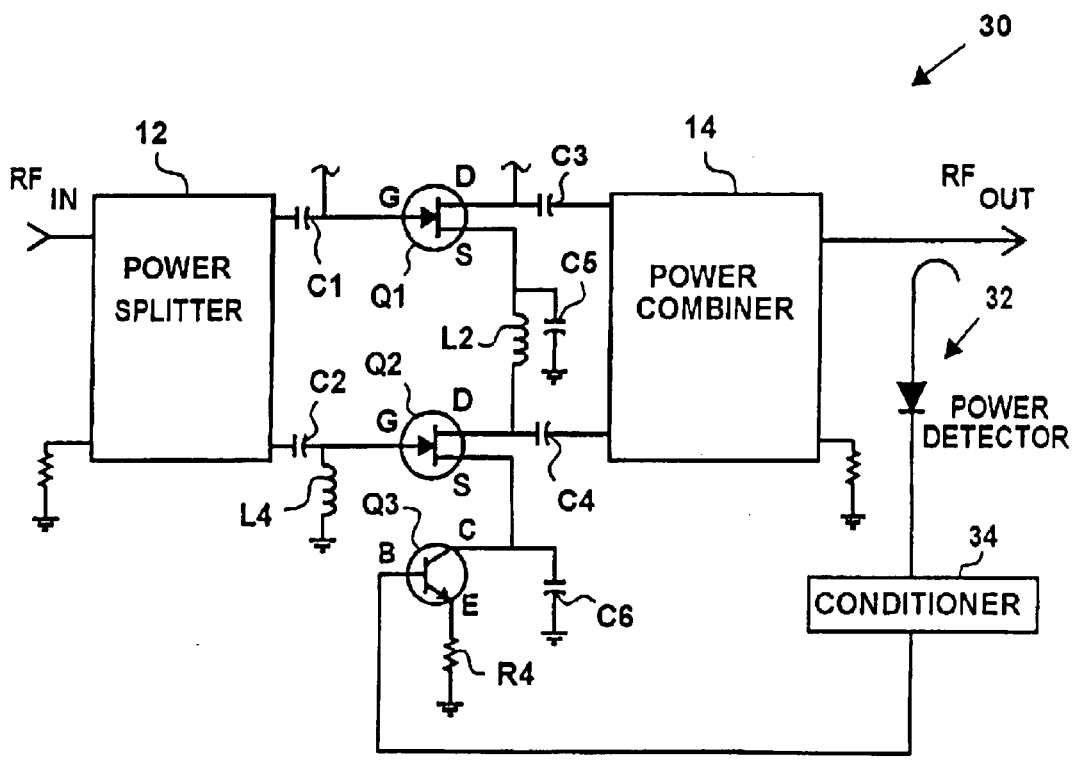
FIG. 3 is an rf power amplifier in which an npn bipolar transistor is stacked with the two FETs, as in FIG. 2, and with feedback from the rf output connected to the npn bipolar transistor, thereby providing an rf power amplifier in which the output can be flattened with respect to frequency, voltage, temperature, and time.

Referring now to FIG. 3, an rf power amplifier 30 includes like-named and like-numbered parts as those of the rf power amplifier 20 of FIG. 2, except that an output power detector 32 and a conditioner 34 are used to feedback a signal from the rf output $RF_{OUT}$ to control the base terminal of the npn bipolar transistor Q3, thereby flattening the rf output $RF_{OUT}$ with respect to frequency, voltage, temperature, and time.

Figure 4:
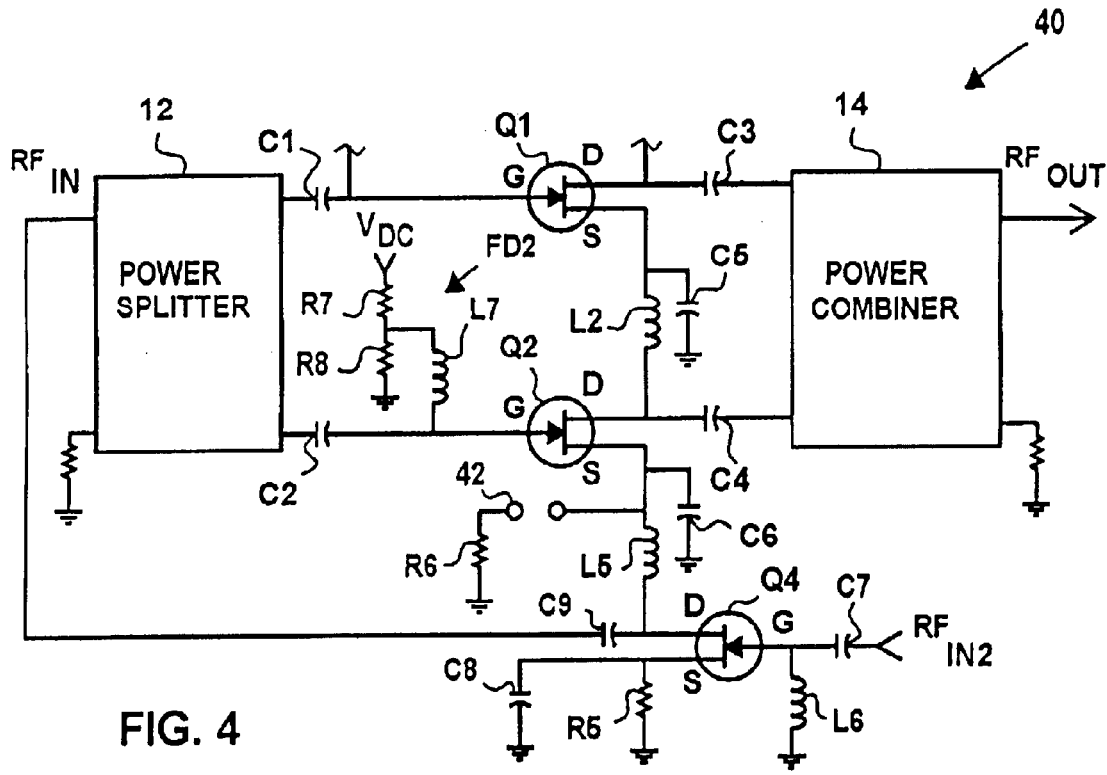
FIG. 4 is an rf power amplifier in which three gallium arsenide FETs are stacked to dividingly share the supply voltage, the lower one of the FETs is a driver that receives an rf input at a gate terminal thereof, and the drain terminal of the driver FET is connected to the rf input of the splitter.

Referring now to FIG. 4, an rf power amplifier 40 includes like-named and like-numbered parts as those of the rf power amplifier 20 of FIG. 2, except that a solid-state current device, GaAsFET, or FET, Q4 replaces the npn bipolar transistor Q3. As shown, the FET Q4 is in totem-pole arrangement with the FETs Q1 and Q2, so that the FETs Q1, Q2, and Q4 share the supply voltage. The FET Q4 is connected as a driver for the FETs Q1 and Q2.

A drain terminal of the FET Q4 is connected to the source terminal of the FET Q2 by a fifth rf choke L5, the source terminal of the FET Q4 is connected to an electrical ground through a resistor R5, a gate terminal of the FET Q4 is connected to an electrical ground through a sixth rf choke L6, and an rf input $RF_{IN2}$, is connected to the gate terminal of the FET Q4 by a coupling capacitor C7. Finally, a decoupling capacitor C8 is connected between the source terminal and an electrical ground.

Since the rf power amplifier 40 includes three FETs, Q1, Q2, and Q4, that are stacked in a totem-pole arrangement, they all share the supply voltage, even though the FET Q4 is configured as a driver for the FETs Q1 and Q2.

Since the FETs Q1 and Q2 each use about 10.0 volts of the total supply voltage, the voltage remaining for use with other field-effect devices in the stack, such as the FET Q4, is limited. Therefore, the FET Q4 is self-biased to a quiescent point close to saturation (Idss) to result in a lower drain-to-source bias. Further, as stated above, the bias voltage on the gate of the FET that is on the bottom of the stack sets the current for all FETs in the stack. To avoid increased current draw, a lower power GaAsFET, for the FET Q4, is used so that when biased close to saturation the current through the stack is correct for FETs Q1 and Q2.

Continuing to refer to FIG. 4, if a GaAsFET of even lower power is used for the FET Q4 so that the current flow through the FETs Q1 and Q2 is insufficient, a resistor R6 may be connected in parallel with the FET Q4 that is used as the driver. As shown in FIG. 4, interconnecting a pair of jumper terminals 42 will place the resistor R6 in parallel with the FET Q4, thereby sharing the current flow with the FET Q4, and thereby avoiding damage to the FET Q4 if its current capacity is insufficient.

The driver, FET Q4, is self-biased and its output is split by the rf power splitter 12 to drive the two final stage power FETs Q1 and Q2, but the FET Q2 requires a negative gate-to-source bias, even as described previously for the FET Q1. The negative gate-to-source bias for the FET Q2 is provided in the same manner as described for the FET Q1. That is, a voltage divider FD2 includes resistors R7 and R8. The negative gate-to-source bias for the FET Q2 is supplied through a seventh rf choke L7. Optionally, the voltage divider FD2 may be replaced by a duplication of the circuit of FIG. 1A, including the operational amplifier OP1 for gate current management.

In operation, the rf input $RF_{IN2}$, that is delivered to the FET Q4 through the capacitor C7, is amplified in the FET Q4, is delivered to the rf input $RF_{IN}$ of the rf power splitter 12 through a capacitor C9, and is power amplified by the FETs Q1 and Q2.

Figure 5:
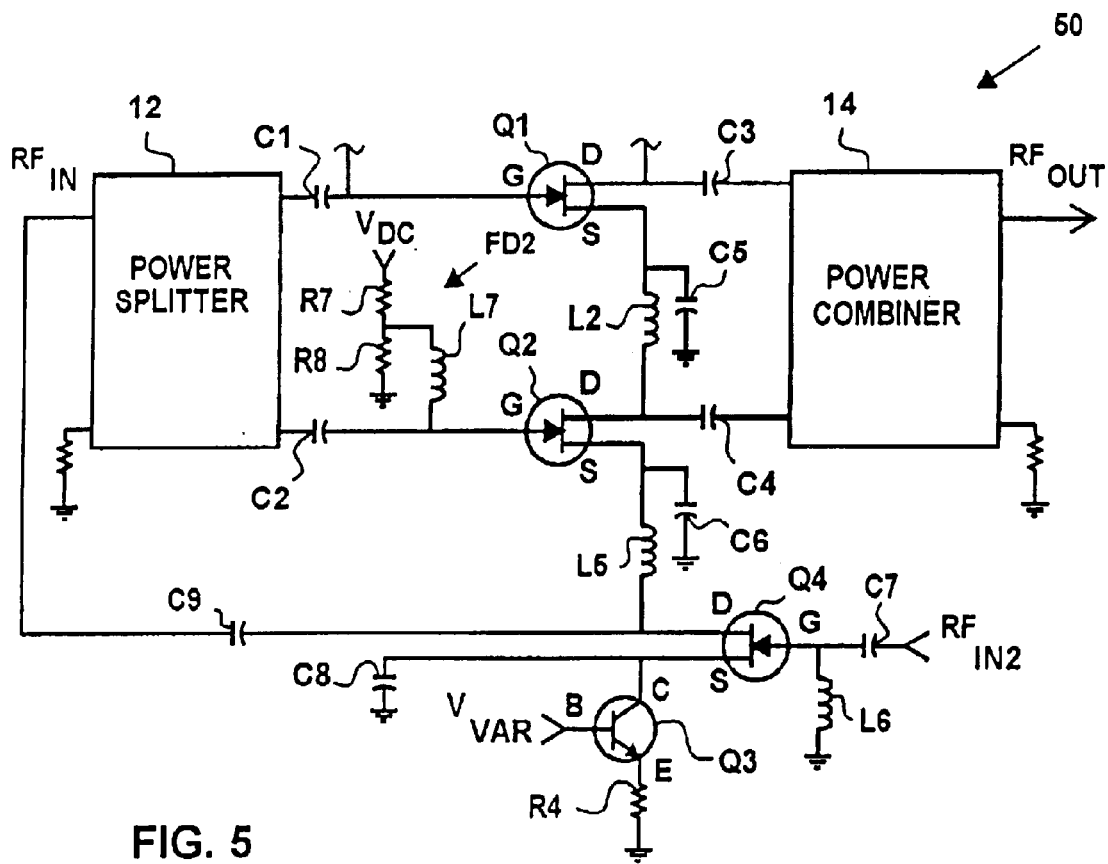
FIG. 5 is an rf power amplifier in which three gallium arsenide FETs and an npn bipolar transistor are stacked, with an rf input to the splitter being provided by a gate of the bottom one of the FETs, and with selectively-variable control of power being provided by the npn transistor.

Referring now to FIG. 5, an rf power amplifier, or variable rf power amplifier 50 includes like-named and like-numbered parts as those of FIG. 4, except that the npn bipolar transistor Q3 is added to the totem-pole arrangement on the bottom of the stack, thereby dividingly sharing the supply voltage, and thereby adding variable amplification of power to the rf power amplifier 40 of FIG. 4.

Figure 6:
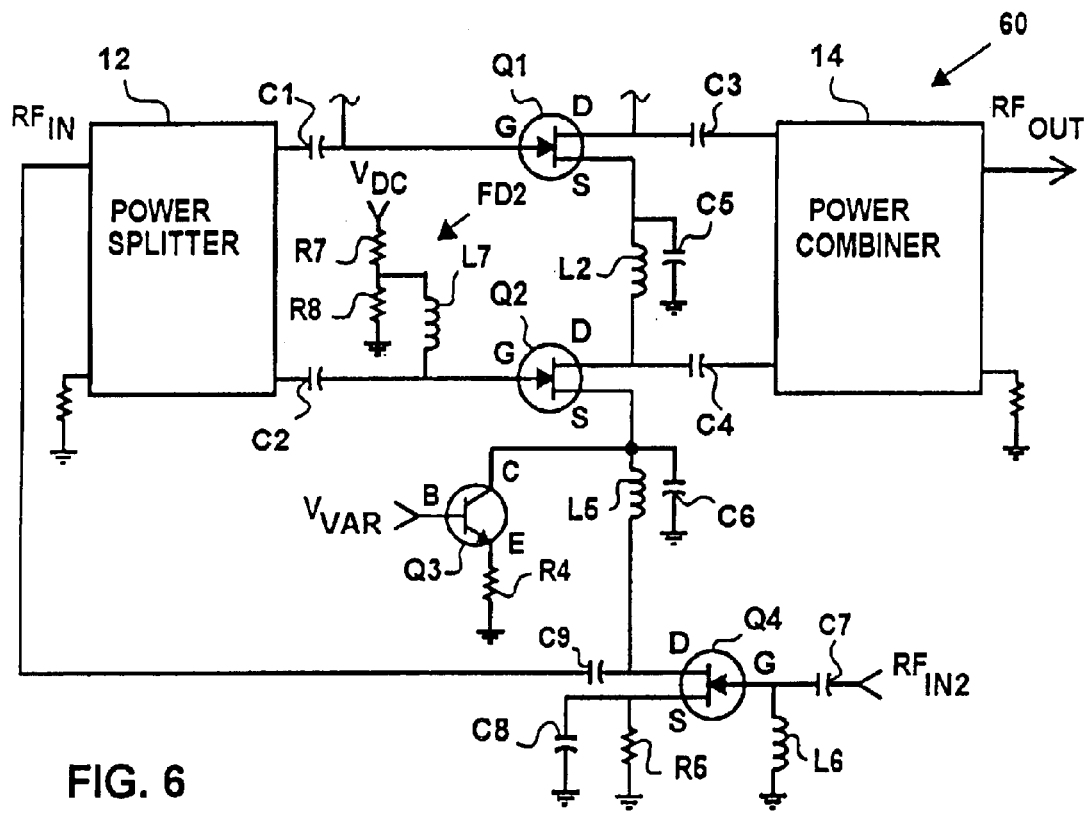
FIG. 6 is an rf power amplifier in which three gallium arsenide FETs are stacked, as in FIG. 4, the lower FET is a driver, and an npn bipolar transistor, being disposed between the lower two FETs, provides selectively variable power.

Referring now to FIG. 6, an rf power amplifier, or variable rf power amplifier 60 includes like-named and like-numbered parts as those of FIG. 5, except that the npn bipolar transistor Q3, is placed in parallel with the driver FET Q4.

Therefore, in the rf power amplifier 60, constant current flow through the FETs Q1 and Q2, as controlled by the FET Q4 is supplemented by variable control of current flow by selectively controlling voltage applied to the base terminal of the npn bipolar transistor Q3, thereby providing a variable rf power amplifier.

Figure 7:
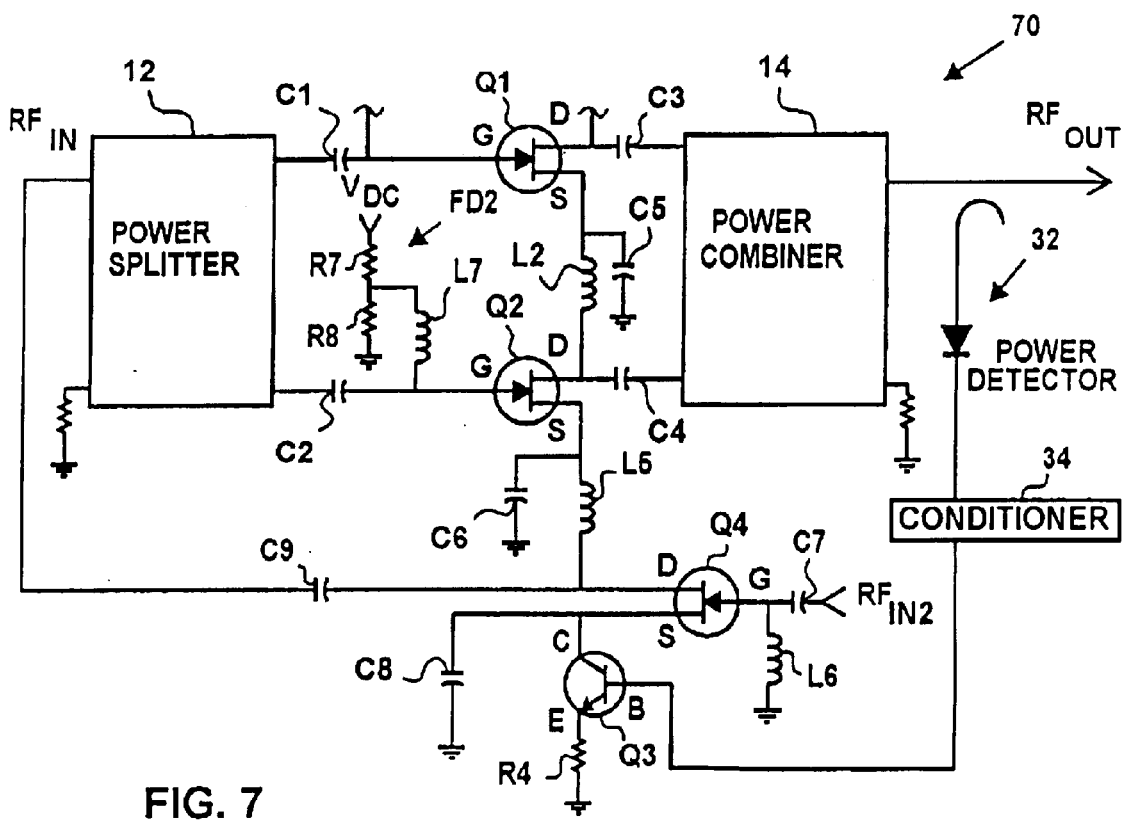
FIG. 7 is an rf power amplifier that uses the rf feedback of FIG. 3 to flatten power amplification of the embodiment of FIG. 5.

Referring now to FIG. 7, an rf power amplifier 70 includes like-named, like-numbered, and like-functioning parts as those of FIG. 5, except that the power detector 32 and the conditioner 34 of FIG. 3 are used to flatten the output power of the rf power amplifier 70, as described in conjunction with FIG. 3. Otherwise, operation of the rf power amplifier 70 is the same as described for the rf power amplifier 50 of FIG. 5.

Figure 8:
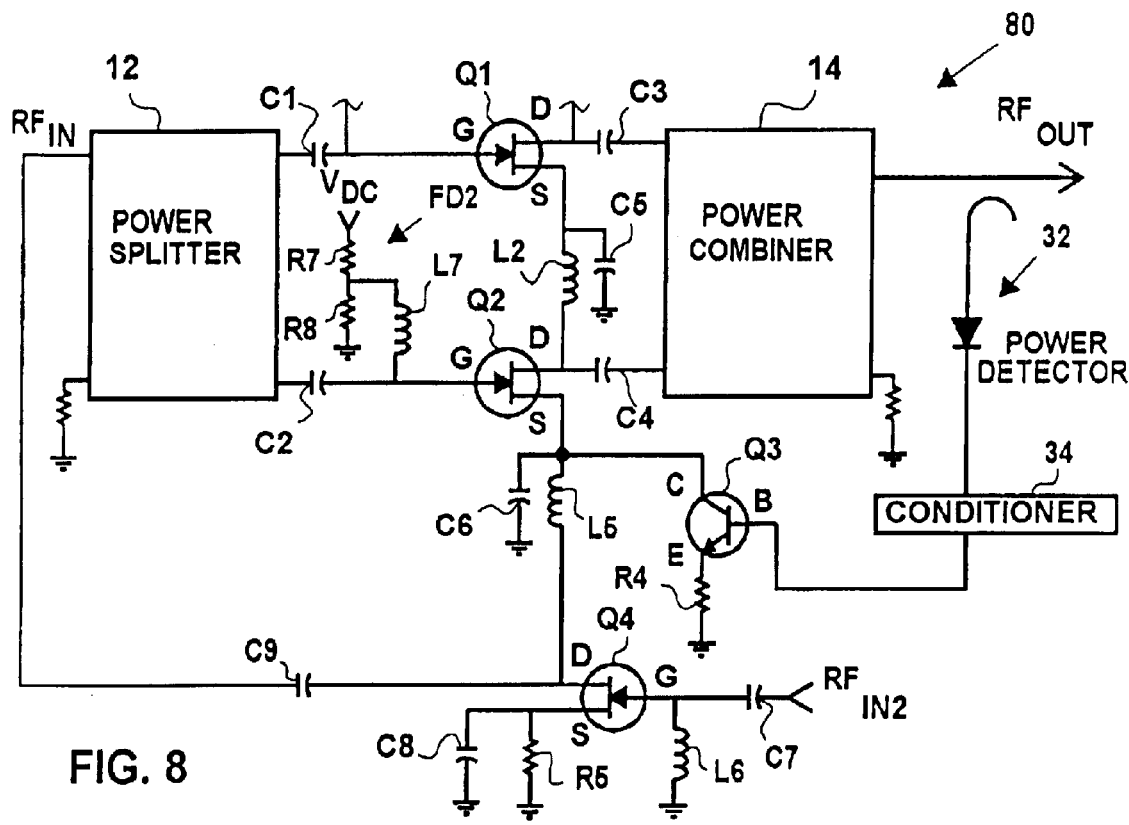
FIG. 8 is an rf power amplifier that uses the rf feedback of FIG. 3 to control the rf power amplifier of FIG. 6.

Referring now to FIG. 8, an rf power amplifier 80 includes like-named, like-numbered, and like-functioning parts as those of FIG. 6, except that the power detector 32 and the conditioner 34 of FIG. 3 are used to flatten the output power of the rf power amplifier 80, as described in conjunction with FIG. 3. Otherwise, operation of the rf power amplifier 80 is the same as described for the rf power amplifier 60 of FIG. 6.

Figure 9:
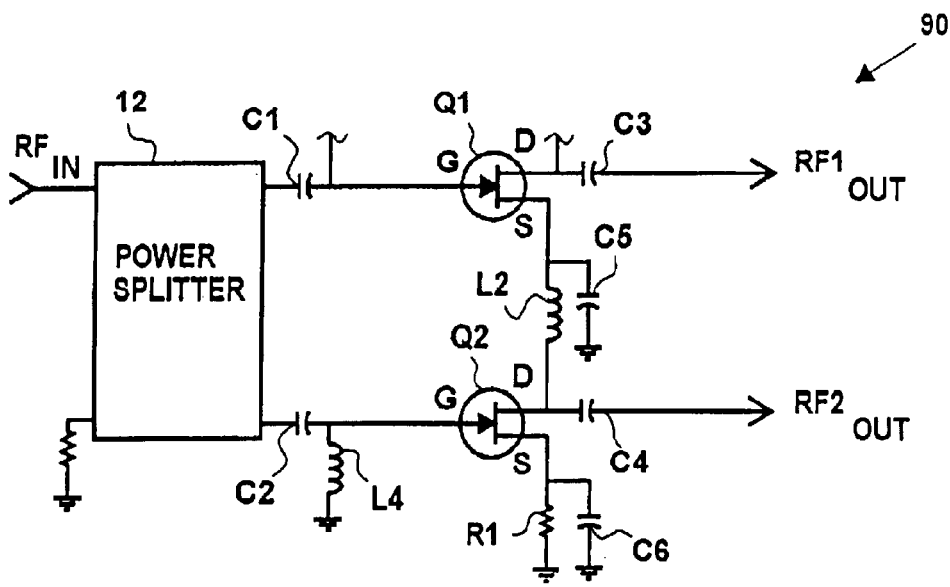
FIG. 9 is an rf power amplifier in which stacked gallium arsenide FETs provide separate rf outputs.

Referring now to FIG. 9, an rf power amplifier 90 includes like-named, like-numbered, and like-functioning parts as those of FIG. 1, except that the rf power combiner 14 has been omitted, so that two rf outputs, $RF1_{OUT}$ and $RF2_{OUT}$, are provided.

By not recombining the rf outputs, $RF1_{OUT}$ and $RF2_{OUT}$ of FETs Q1 and Q2, the amplifier may be used as a dual output amplifier/transmitter. The dual rf outputs, $RF1_{OUT}$ and $RF2_{OUT}$ may be used for driving multiple antennas, not shown, not an inventive part of the present invention.

Figure 10:
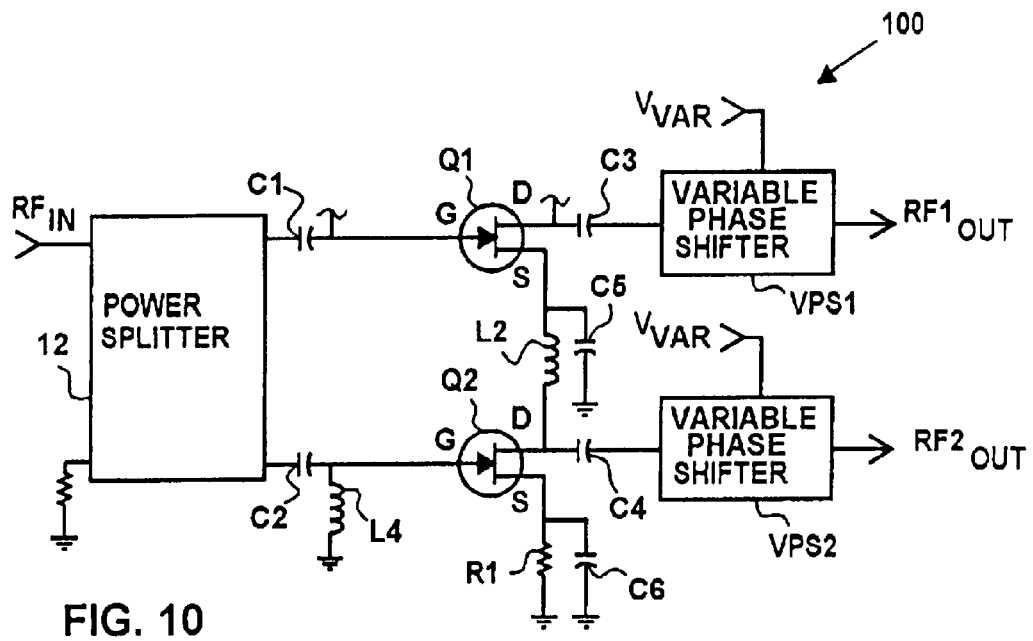
FIG. 10 is an rf power amplifier in which stacked gallium arsenide FETs, combined with variable phase shifters, provide two rf outputs that may be phase shifted variably and independently.

Referring now to FIG. 10, an rf power amplifier 100 includes like-named, like-numbered, and like-functioning parts as those of FIG. 9, except that variable phase shifters, VPS1 and VPS2, are interposed between the FETs, Q1 and Q2, and the rf outputs, $RF1_{OUT}$ and $RF2_{OUT}$. Optionally, only one phase shifter, VPS1 or VPS2, may be used. The rf power amplifier 100 may be used for driving phased antenna arrays.

Figure 11A:
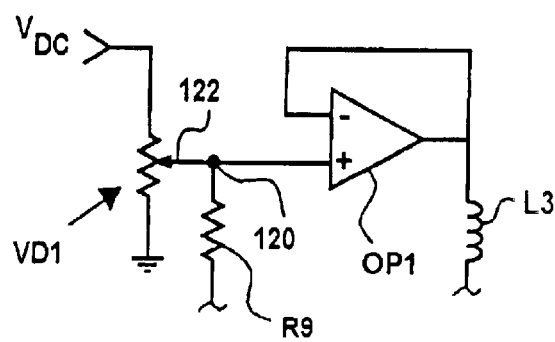
FIG. 11A optionally replaces the fixed voltage divider of FIG. 11 with a potentiometer, adds a buffer for the gate-to-source bias, and provides for feedback from a power detector and a conditioner to a wiper of the potentiometer.
Figure 11:
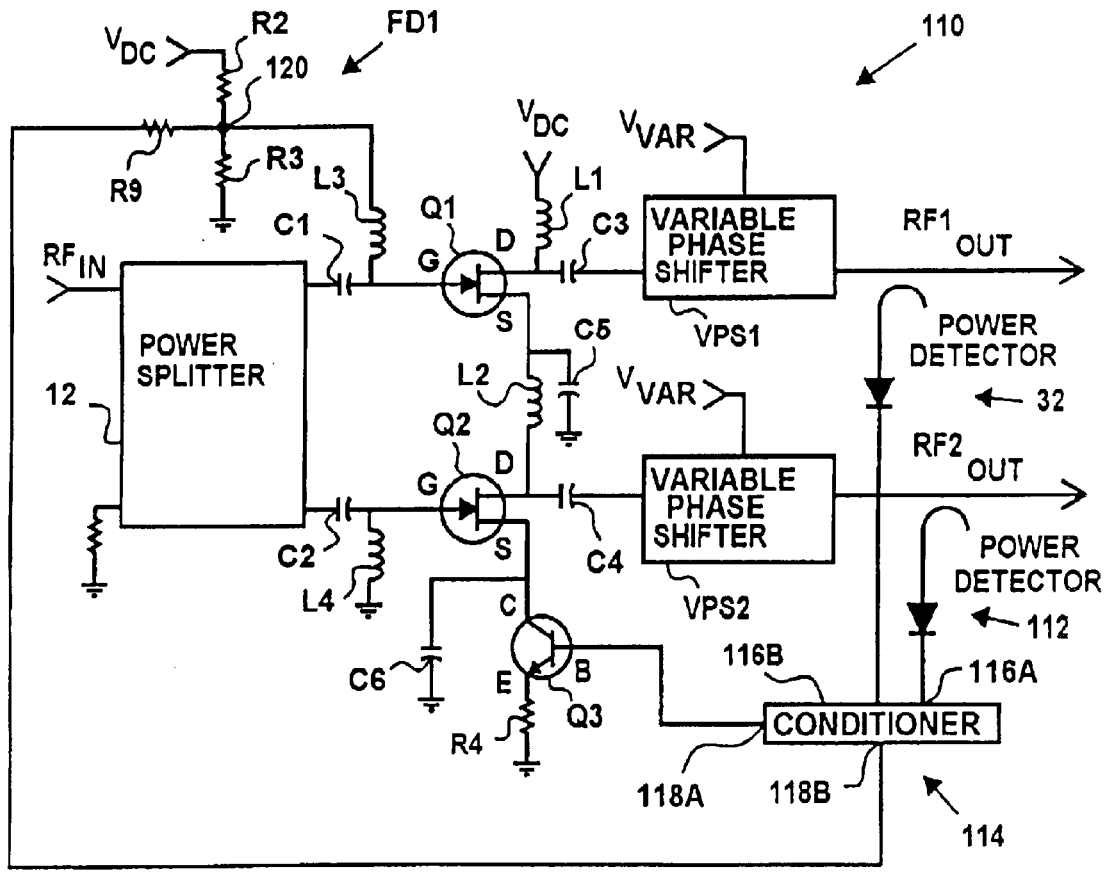
FIG. 11 is an rf power amplifier in which a feedback control, similar to that of FIG. 3, has been added to the rf power amplifier of FIG. 10.

Referring now to FIG. 11, an rf power amplifier 110 includes like-named, like-numbered, and like-functioning parts as those of FIG. 10; except that two output power detectors, 32 and 112, a conditioner 114, the transistor Q3, and a summing resistor R9 are added.

As shown in FIG. 11, the conditioner 114 has two inputs, 116A and 116B, that are connected to the power detectors, 32 and 112, respectively, and two outputs, 118A and 118B. The output 118A is connected to the base terminal of the transistor Q3, and functions with the transistor Q3 as described in conjunction with FIG. 3. The output 118B of the conditioner 114 is connected to a summing node 120 of the voltage divider FD1 by the resistor R9.

In addition to flattening the rf outputs, $RF1_{OUT}$ and $RF2_{OUT}$ as a function of the connection of the output 118A of the conditioner 114 to the transistor Q3, the output 118B of the conditioner 114 automatically equalizes the dual rf outputs, $RF1_{OUT}$ and $RF2_{OUT}$.

That is, as mentioned previously, the rf outputs of the FETs Q1 and Q2 may be balanced by adjusting the voltage divider VD1 of FIG. 1A. In like manner, the rf outputs, $RF1_{OUT}$ and $RF2_{OUT}$, of the FETs Q1 and Q2 are automatically balanced by the power detector 112 and the output 118B of the conditioner 114. Feedback from the output 118B variably adjusts the gate-to-source bias of the FET Q1 by summing, at the summing node 120, the output 118B of the conditioner 114 with that of the voltage divider FD1.

Referring now to FIG. 11A, if the potentiometer VD1 of FIG. 1A is used instead of the voltage divider FD1, the summing resistor R9 is connected to the wiper 122 of the potentiometer VD1 at the node 120. As discussed with FIG. 1A, and as shown in FIG. 11A, the operational amplifier OP1 is used as a buffer.

Figure 12:
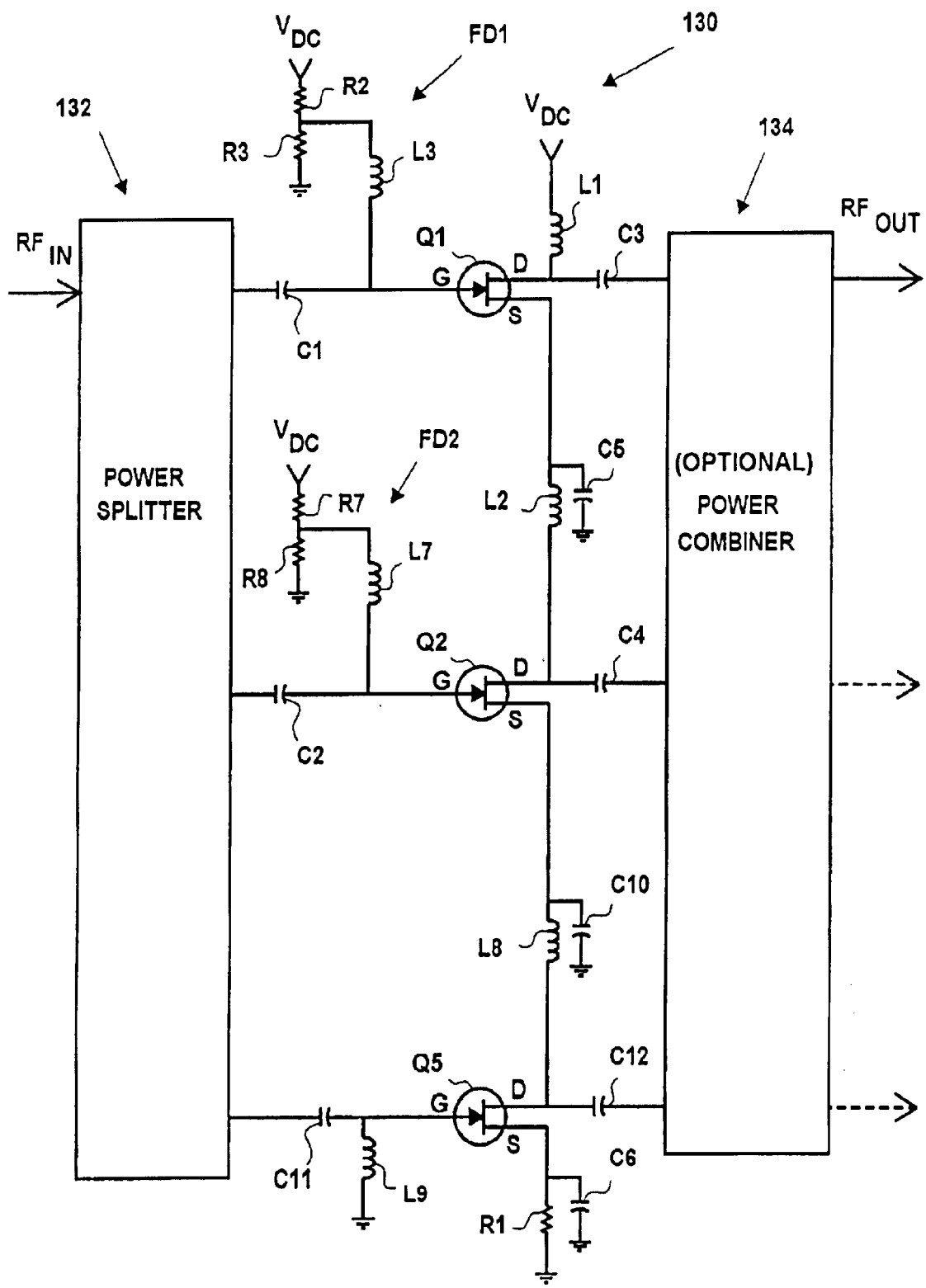
FIG. 12 is an rf power amplifier in which three gallium arsenide FETs are stacked, a three-way rf splitter splits the rf input to three FETs, and a three-way rf combiner is optionally included to combine the amplified rf.

Referring now to FIG. 12, an rf power amplifier 130 includes like-named and like-numbered parts as those in the rf power amplifier 10 of FIG. 1, except as specified. More particularly, the rf power amplifier 130 includes a three-way power splitter 132, a three-way power combiner 134 that is optional, a solid-state current device, gallium arsenide FET, GaAsFET, or FET, Q5, a decoupling capacitor C10, an rf choke L8, coupling capacitors C11 and C12, an rf choke L9, and the voltage divider FD2.

If the voltage of the voltage source permits, additional FETs or bipolar transistors may be included in the stack as taught in conjunction with previous drawings, or as will be taught subsequently, thereby saving the current that the additional FETs and/or bipolar transistors would draw. Further, current control or feedback may be added as shown and described previously, or as shall be described subsequently.

As shown in FIG. 12, the rf power amplifier 130 optionally includes the three-way combiner 134. Thus, variations of the rf power amplifier 130 include omitting the three-way combiner 134, thereby producing three rf outputs, as indicated by arrows in dash lines, any or all of which may be variably shifted as shown in FIG. 10.

Figure 13:
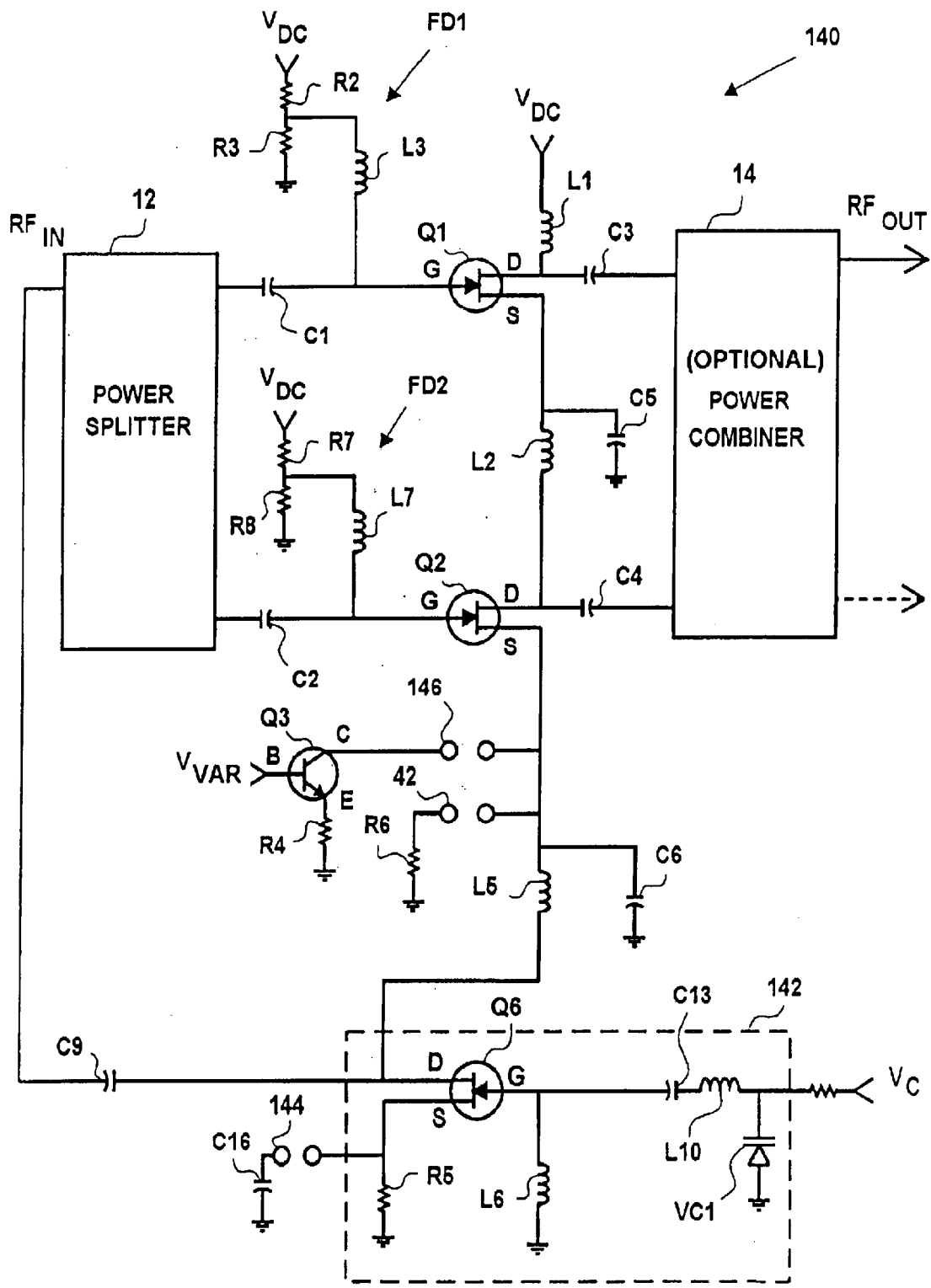
FIG. 13 is an rf power amplifier in which two gallium arsenide FETS are stacked, a third FET is included in the stack as a driver, the rf input is generated by a VCO that controls a gate-source voltage of the driver FET, optionally, amplification is variably controlled by an npn transistor, and a power combiner is optional.

Referring now to FIG. 13, an rf power amplifier 140 includes like-named and like-numbered components as those shown in FIG. 6, except that a voltage controlled oscillator, or VCO, 142 replaces the FET Q4, and a pair of jumper terminals 144 and a pair of jumper terminals 146 are added. The VCO 142 includes a varactor VC1, an inductor L10, a capacitor C13, the rf choke L6, a solid-state current device, gallium arsenide FET, GaAsFET, or FET Q6, and the resistor R5. The VCO 142 produces an rf output signal that is varied in frequency by changing a control voltage Vc applied to the varactor VC1.

As shown in FIG. 13, the VCO 142 drives the rf input $RF_{IN}$ of the power splitter 12. However, if the VCO 142 does not provide sufficient rf power for the power splitter 12, a decoupling capacitor C16 may be added by interconnecting the pair of jumper terminals 144.

If the current drain of the FET Q6 is less than desired for the FETs Q1 and Q2, the resistor R6 may be added by interconnecting the jumper terminals 42, and/or the current flow may be variably increased by interconnecting the pair of jumper terminals 146, thereby placing the transistor Q3 in parallel with the FET Q6.

Using a FET with the VCO 142, such as the FET Q4, and placing the FET Q6 in the stack, eliminates the additional current drain of the FET Q6.

Alternately, the VCO may be used to drive a bipolar transistor, such as the transistor Q3. By placing the transistor Q3 in the stack, in the place of the FET Q6, similar advantages are achieved.

Figure 14:
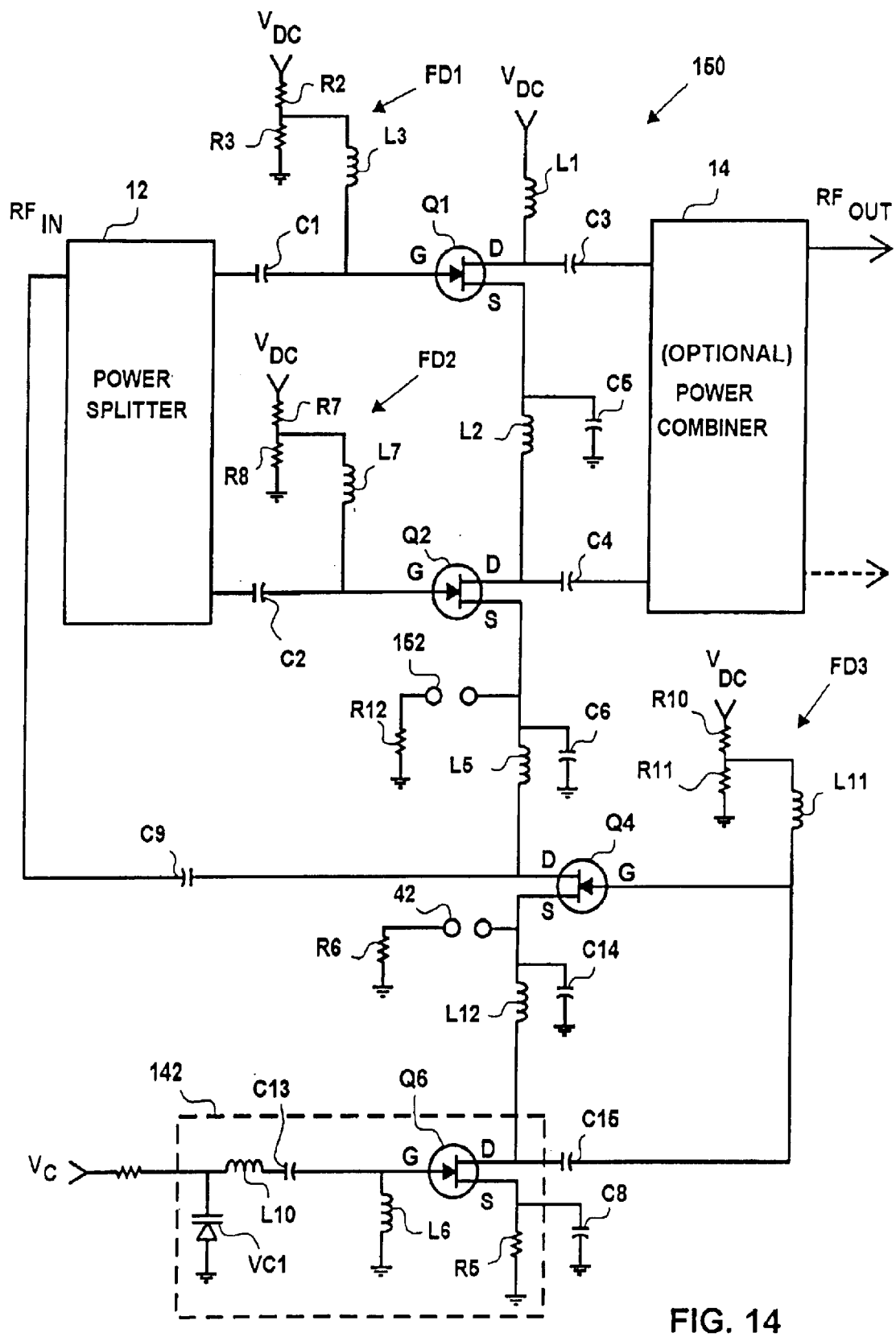
FIG. 14 is an rf power amplifier as shown in FIG. 13, except that a fourth FET is included in the stack as a series dc driver for the VCO, thereby minimizing power requirements for the VCO.

Referring now to FIG. 14, an rf power amplifier 150 includes like-named and like-numbered components as in FIG. 13, except for the addition of the FET Q4, a fixed voltage divider FD3 that includes resistor R11, an rf choke L11, a resistor R12, a pair of jumper terminals 152, an rf choke L12, a decoupling capacitor C14, and a coupling capacitor C15.

The rf power amplifier 150 functions as described for the rf power amplifier 140 of FIG. 13, except for insertion of the FET Q4 as a driver. The jumper terminals 152 and the resistor R12 provide means for adding current flow to that of the FET Q4, as described previously, and the resistor R6 provides means for adding current flow to the FET Q6, thereby increasing current flow through the FETs Q1 and Q2.

Figure 15:
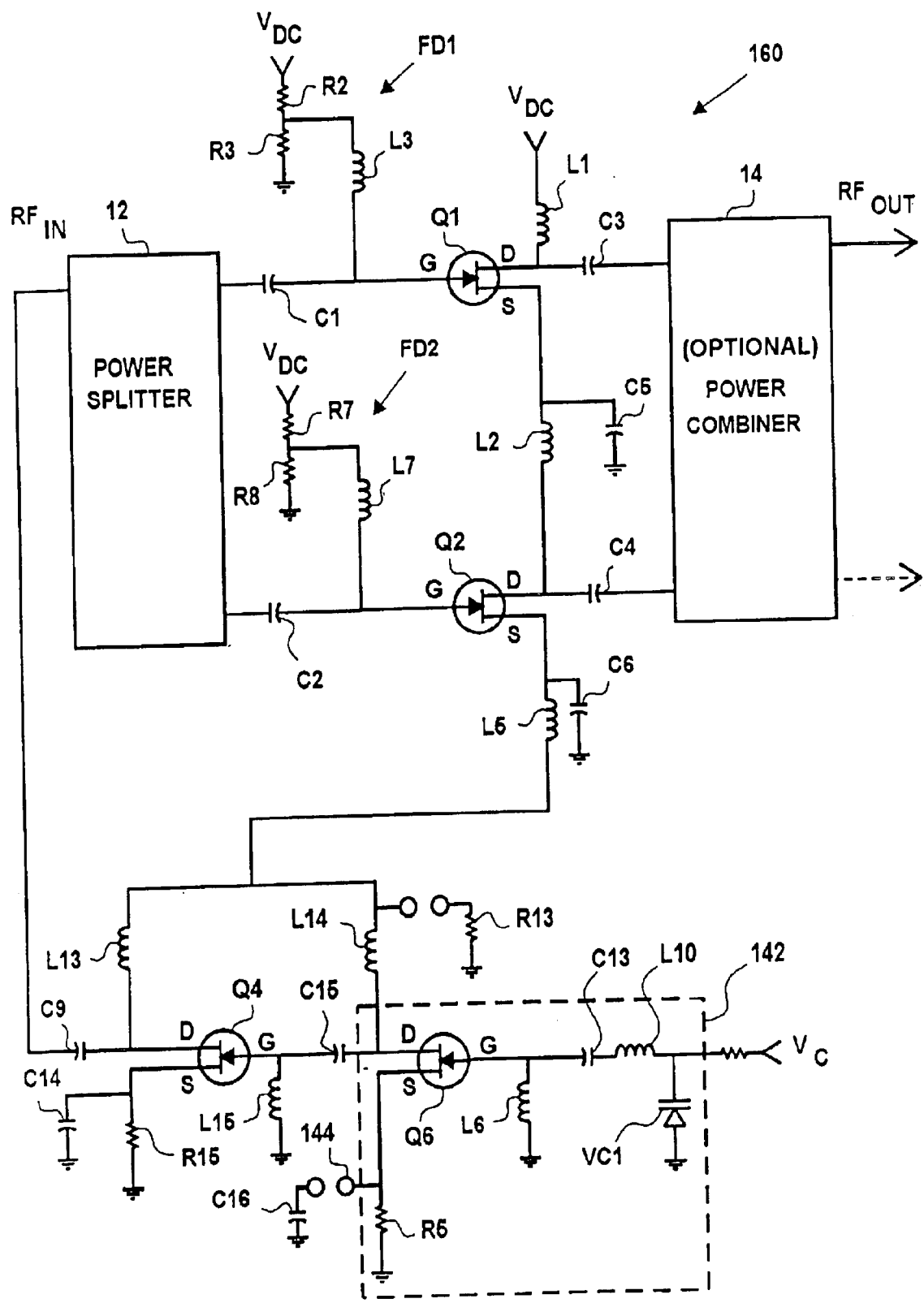
FIG. 15 is an rf power amplifier, as shown in FIG. 14, except that third and fourth FETs are connected in parallel with each other, and are connected in series with the first and second FETs, thereby both lowering the required dc voltage and minimizing the need for current shunting, as opposed to the FIG. 14 embodiment.

Referring now to FIG. 15, an rf power amplifier 160 includes like-named and like-numbered components as in FIG. 14, except the FETs Q4 and Q6 are connected in parallel, instead of being connected in series as in FIG. 14. In addition, a connection between the source terminal of the FET Q2 and drain terminals of the FETS Q4 and Q6 includes rf chokes L13 and L14. An rf choke L15 is connected from the gate of the FET Q4 to an electrical ground, and resistors R13 and R15 are added.

By placing the FETs Q4 and Q6 in parallel, these two FETs share the current flow through the FETs Q1 and Q2, thereby reducing the need to shunt additional current flow past the FETs Q4 and Q6 by the use of a parallel-connected resistor, resistor R13. That is, the combined current flow through the FETs Q4 and Q6, for some applications, may still be lower than the current flow that is desired for the FETs Q1 and Q2, but the need for current shunting will be less for the FIG. 15 embodiment than it is when the FETs Q4 and Q6 are connected in series, as in FIG. 14.

Figure 16:
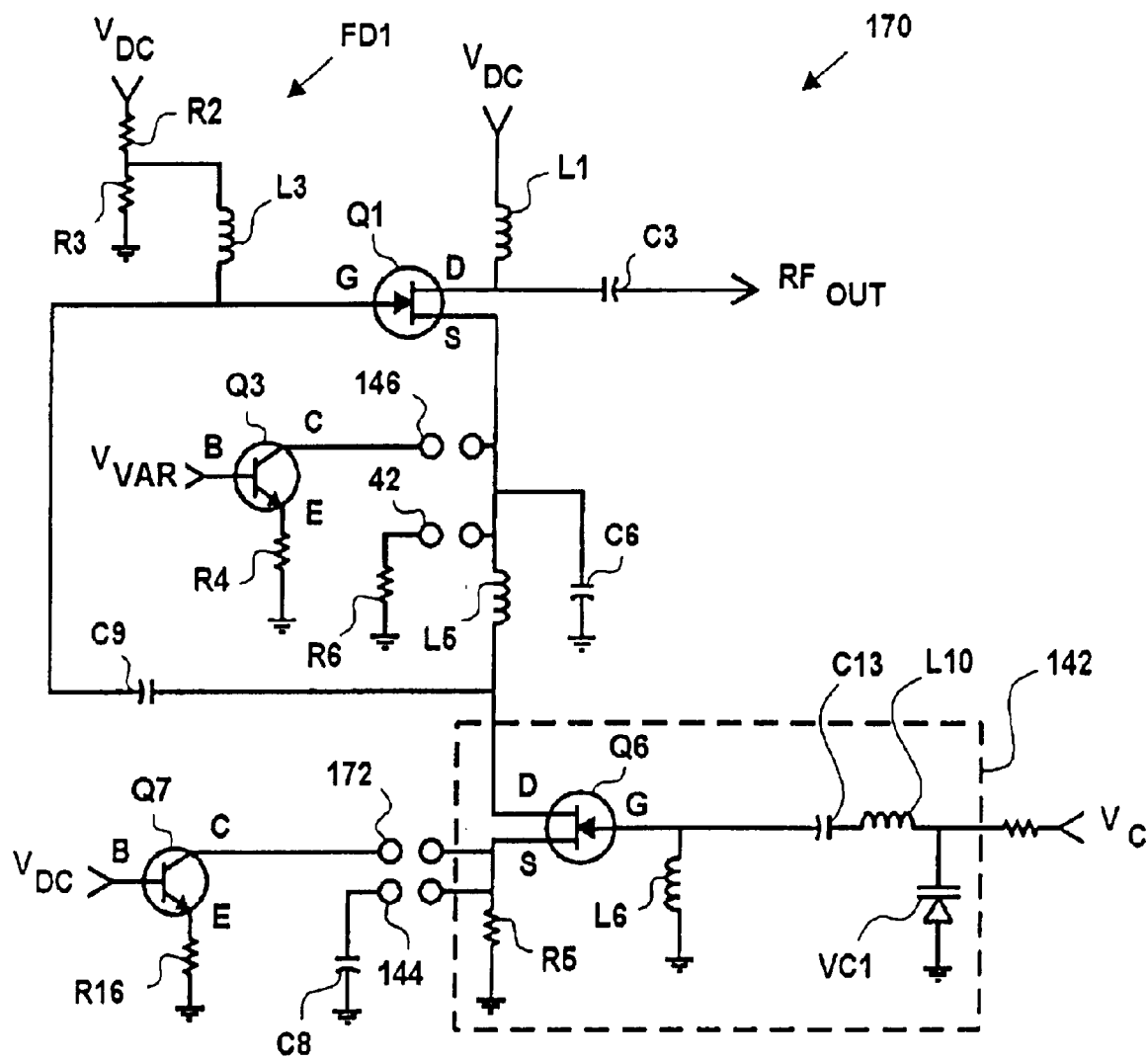
FIG. 16 is a basic rf power amplifier of the present invention in which a single FET amplifier and a VCO are stacked, showing optional control of amplification by npn transistors.

Referring now to FIG. 16, an rf power amplifier 170 is provided for relatively-low power applications. The rf power amplifier 170 includes like-named and like-numbered components as those shown and described in conjunction with FIG. 13, except for omission of the FET Q2, the power splitter 12, and the power combiner 14, and except for the addition of an npn bipolar transistor Q7, a pair of jumper terminals 172, and a resistor R16.

As described in conjunction with FIG. 13, the VCO 142 includes the FET Q6, but in the embodiment of FIG. 16, the FET Q1 is the sole and final source of amplifier rf power, since the FET Q2 and the power splitter 12 have been omitted.

In like manner as shown and described in conjunction with FIG. 13, the bipolar transistor Q3 and/or the resistor R6 may be used to shunt the current flow through the FET Q6, thereby providing a more adequate flow of current through the FET Q1 that supplies rf power.

That is, connection of the jumper terminals 42 provides an increase in rf power, connection of the jumper terminals 146 provides variably-increased power, and connection of both pairs of jumper terminals, 42 and 146, provides rf power that is both increased and variably increased. Finally, as previously discussed, the capacitor C8 may be used to increase the power output of the VCO 142 by connecting jumper terminals 172.

The rf power amplifier 170 may be used as a stand-alone amplifier/transmitter for applications in which relatively lower rf power is sufficient. Alternately, the rf power amplifier 170 may be used, in parallel with a stack of FETs, such as the FETs Q1, Q2, and Q5 of FIG. 12.

Figure 17:
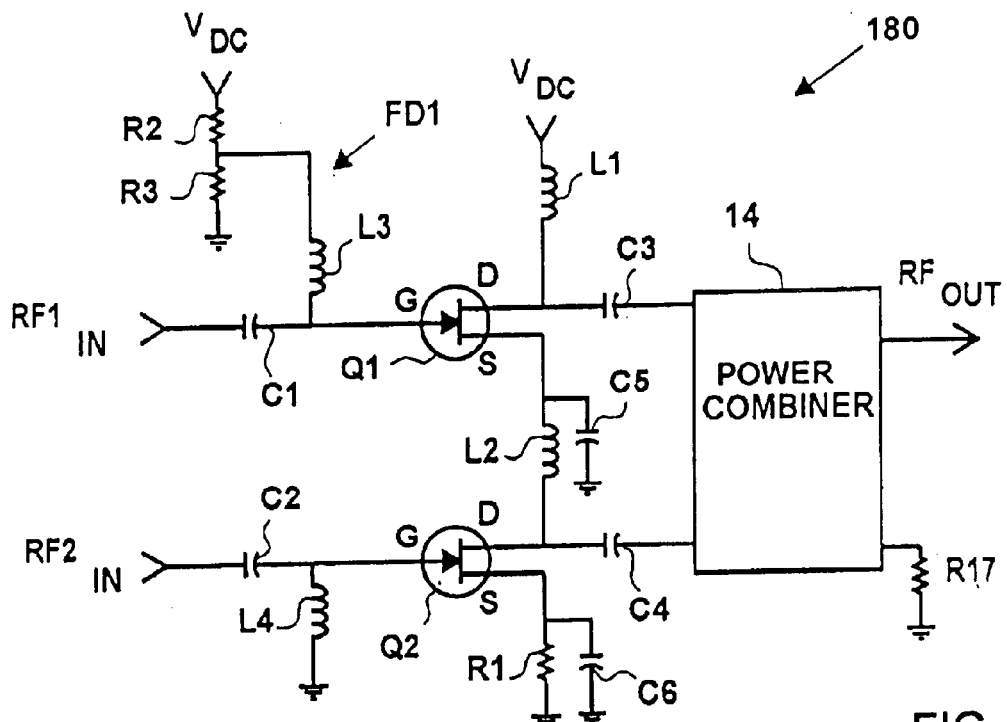
FIG. 17 is an rf power amplifier in which separate rf inputs, are separately amplified, and then combined to produce both rf inputs in a single rf output.

Referring now to FIG. 17, an rf power amplifier 180 includes like-numbered and like-named components as those in the rf power amplifier 10 of FIG. 1, except for omission of the power splitter 12, and addition of a resistor R17.

Two rf inputs, $RF1_{IN}$ and $RF2_{IN}$, are connected to the FETs Q1 and Q2, respectively. The two rf inputs, $RF1_{IN}$ and $RF2_{IN}$, may be of different frequencies within the range of the power combiner 14, may be of different rf levels, and may be modulated by different types of modulation. Further, gains of the FETs Q1 and Q2 may be set differently, by any suitable means, such as selectively determining drain-source voltages.

The rf power amplifier 180 has the unique ability to produce a single rf output that includes the two separately amplified rf outputs, although power, equal to the rf output, $RF_{OUT}$, is dissipated across the resistor R17. The rf output, $RF_{OUT}$, is equal to $(A_1 RF1_{IN}/2)+(A_2 RF2_{IN}/2)$, where $A_1$ and $A_2$ are gains of the FETs Q1 and Q2, respectively.

Referring now to the rf power amplifiers of FIGS. 1–16, the objective of all of the totem-pole FET amplifiers shown and described herein is to minimize power loss in a voltage regulator circuit, thereby increasing the power efficiency of the rf amplifier. The only limitation to the number of devices that can be stacked is the maximum voltage that is available.

It should be understood that the rf power amplifiers shown and described herein can be modified to include features and components shown and described in conjunction with other embodiments.

For instance, the rf power amplifiers shown and described herein may include such features as dual or triple rf outputs, phase-shifted rf outputs, variable control of power, current shunting, rf feedback, buffer control of gate-source voltages by an operational amplifier configured as a buffer, and use of a VCO to generate an rf input.

Referring now to FIGS. 1–11 and 13–15, the rf power splitter 12 and the rf power combiner 14 are typically quadrature hybrids or Wilkinson power dividers. However, any practical method of splitting and combining may be used to practice the present invention.

The three-way splitter 132 and the three-way combiner 134 may be constructed in accordance with textbook technology. For instance, technical information for constructing splitters that will split three or more ways can be found in Microwave Engineering, Second Edition, by David M. Pozar, pages 363–368, New York: John Wiley & Sons, Inc., 1998.

Referring again to FIG. 1, as stated previously, the amplification function of the FETs, such as the FETs Q1 and Q2, is maintained by using rf chokes, such as the rf chokes, L1, L2, L3, and L4, to keep the rf signal from getting onto the dc bias lines and to prevent rf interference between the series-connected FETs; and decoupling capacitors, such as the capacitors C5 and C6, are used to keep the sources of FETs at an rf ground.

The selection of the decoupling capacitors and chokes are both critical to the rf performance of the circuit, particularly for high power rf amplifiers, although selection of decoupling capacitors is the most critical. Decoupling capacitors, such as the decoupling capacitors C5, C6, C8, C10, C14, and C16 are selected for both resonant frequencies at or very near to the circuit operating frequency and the lowest possible effective (or equivalent) series resistances (ESRs). The rf chokes, such as the rf chokes L1, L2, L3, and L4, preferably are inductors with self-resonant frequencies at or very near to the circuit operating frequency.

Figure 18:
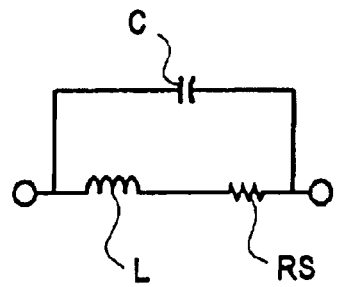
FIG. 18 is a model for simulating a microwave inductor.

Referring now to FIG. 18, the microwave circuit model of an inductor is a series resistor Rs and inductor L in parallel with a capacitor C. The resistor Rs represents the dc coil resistance along with the increased wire resistance at rf frequencies due to the skin effect (the effect of the current being concentrated nearer to the surface of the wire) as the operational frequency is increased. The capacitor C represents the distributed capacitance between the parallel windings of the coils. Inductance of the inductor L is the nominal component inductance.

At operation below the self-resonant frequency, the impedance of an inductor increases as frequency increases. At the inductor self-resonant frequency, the inductor, as represented by the parallel L/C circuit of FIG. 18, resonates as an open circuit creating a maximum impedance to the rf signal. At operation higher than the self-resonant frequency, the distributed capacitance of capacitor C dominates the rf impedance resulting in the impedance decreasing with increasing frequency. The inductor self-resonant frequency is given as: $F_{SR}=1/[2\pi^*\sqrt{(LC)}]$.

A resistance of the series resistor Rs limits the maximum impedance of the self-resonant inductor. That is, the quality factor (Q) of the inductor is the ratio of an inductor's reactance to the resistance of the series resistor Rs. High-Q inductors, with very low resistances, have very high self-resonant impedances, but for only a narrow bandwidth. Lower-Q inductors, with higher resistances, have lower self-resonant impedances for a much broader bandwidth.

This self-resonant feature is used in the circuit to prevent the rf signal from coupling onto the dc bias lines and to aid the decoupling capacitors in preventing rf crosstalk between the two, or more, FETs. For narrow-band operation, very high-Q inductors are desired to maximize series impedance. Quarter wave transformers may also be used for this function in narrow-band applications. For broad-band operation, lower-Q inductors are desired to obtain a high impedance across a larger bandwidth. In either application, the inductor must be capable of passing the maximum dc current without breakdown.

Utilizing the self-resonant characteristics of decoupling capacitors, such as the capacitors C5 and C6, is required to optimize rf performance while maximizing dc-rf conversion efficiency, particularly in applications where the rf power exceeds 100 milliwatts.

Figure 19:
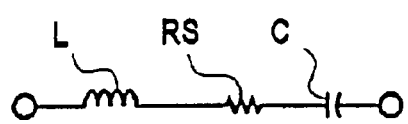
FIG. 19 is a model for simulating a microwave capacitor.

Referring now to FIG. 19, the microwave circuit model of a capacitor is an inductor L in series with a resistor Rs in series with a capacitor C. The inductor L represents the inductance of the leads and the capacitor plates. The resistor Rs represents the equivalent series resistance, or ESR, of the capacitor. Capacitor dielectric losses, metal plate losses, and skin effects all contribute to the ESR. The capacitor C is the nominal component capacitance.

These parasitic effects of a capacitor at microwave frequencies alter its impedance characteristics in the opposite manner as that of an inductor. At operation below the self-resonant frequency, a capacitor decreases in impedance as frequency increases. At the capacitor self-resonant frequency, a capacitor, as represented by the series L/C circuit of FIG. 19, resonates as a short circuit creating a minimum impedance to the rf signal. At frequencies higher than the self-resonant frequency, the lead and plate inductance L dominates the rf impedance resulting in the impedance increasing with increasing frequency. The capacitor self-resonant frequency equation is: $F_{SR}=1/[2\pi^*\sqrt{(LC)}]$, which is the same as for the inductor.

The rf impedance of a capacitor at self-resonant frequency is equal to the ESR. As in the case of the inductor, the quality factor Q of a capacitor is the ratio of a capacitor's reactance to its ESR, or alternatively the quality factor Q is 1/DF where DF is the dissipation factor of the capacitor. High-Q capacitors, with very low ESR, have very low self-resonant impedances, but for only a narrow bandwidth. Lower-Q capacitors, with higher ESR, have lower self-resonant impedances for a much broader bandwidth. Presently, the preferred capacitor dielectric to minimize capacitor ESR is porcelain. Porcelain has a dissipation factor, DF, of 0.00007, the lowest of all currently available capacitor dielectrics.

To minimize the rf impedance from the FET source terminal to a circuit ground, decoupling capacitors with self-resonant frequencies at or very near to the amplifier-operational frequency are required in higher-power rf applications.

The power dissipated in the decoupling capacitor is $P_{DISS}=I^2*ESR$, where I is the root-mean-square, or rms, of the rf current through the capacitor. Alternatively, $P_{DISS}=P_{RF}*ESR/Z$ where Z is the circuit load impedance, typically 50 ohms, and $P_{RF}$ is the rf output power of the FET.

For optimal performance, the ratio of FET rf output power, $P_{RF}$, to decoupling capacitor power dissipated, $P_{DISS}$, should be no less than 2000 for medium rf power, which is defined as 100 milliWatts to two Watts FET rf output power. For high power rf applications, which is defined as FET output power greater than 2 Watts, the $P_{RF}/P_{DISS}$ ratio should be no less than 5000.

Very high-Q decoupling capacitors are necessary to minimize series impedance to a circuit ground, whether it be for narrow-band, or wide-band operation. For broad-band operation, multiple high-Q decoupling capacitors with self-resonant frequencies selected at several points in the operating frequency band are optimally selected for minimum ESR across a broad frequency band.

Figure 20:
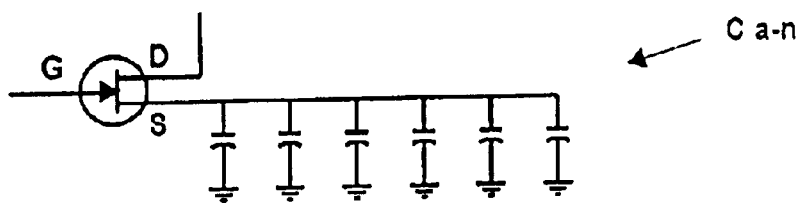
FIG. 20 shows the use of multiple decoupling capacitors to minimize the equivalent series resistance (ESR) of the decoupling capacitors.

Referring now to FIG. 20, two or more multiple porcelain dielectric capacitors Ca-n, each with self-resonant frequencies at or near the amplifier-operational frequency, are connected in parallel from the FET source terminal to a circuit ground to achieve the low required decoupling capacitor ESR for high-power rf applications.

Paralleling a plurality of capacitors at the self-resonant frequency divides the ESR in the same manner as paralleling resistors. However, if a capacitor is not available with a resonant frequency that closely matches an operating frequency for narrow-band operation, two paralleled capacitors are chosen with one having a resonant frequency above the narrow-band frequency, and the other having a resonant frequency below the narrow-band frequency.

Referring now to FIGS. 1–17 and 20, preferably the effective series resistances of the decoupling capacitors C5, C6, C8, C10, C14, and/or C16 each have an effective series resistance of less than 0.40 ohms divided by the rf output power. Preferably, all of these decoupling capacitors have an effective series resistance of 0.20 ohms divided by the rf output power.

If the required ESR, as calculated by either of the formulas given above, for any or all of the decoupling capacitors C5, C6, C8, C10, C14, and C16 cannot be met by a single capacitor, any or all may be replaced by any number of the paralleled capacitors Ca-n, as shown in FIG. 20.

Porcelain capacitors presently have the lowest dielectric resistance and are preferred for minimizing the effective rf impedance. Porcelain capacitors, model 600S, manufactured by *American Technical Ceramics* of Huntington Station, N.Y., are suitable for rf decoupling as taught herein.

Model 600S capacitors that are available from *American Technical Ceramics*, their self resonant frequencies, their capacities, and their effective series resistances, are included in the following table.

TABLE 1

Porcelain Capacitors
Self Resonant Frequencies vs. ESRs

| Self Resonant Freq. | Capacitance | ESR |
| --- | --- | --- |
| 1 Ghz | 100 pF | 0.07 ohms |
| 2 Ghz | 40 pF | 0.09 ohms |
| 4 Ghz | 15 pF | 0.15 ohms |
| 8 Ghz | 3 pF | 0.20 ohms |
| 16 Ghz | 1 pF | 0.30 ohms |

Referring now to FIG. 20 and Table 1, as an example of capacitor paralleling to achieve a required ESR, assume an rf output of five Watts, using the 0.2 ohms/Watts criteria, the ESR of the decoupling capacitor should be 0.04 ohms. Assuming an operating frequency of 4 Ghz, from Table 1, the ESR for a porcelain capacitor is 0.15 ohms, so four capacitors must be paralleled to achieve the required ESR.

Packaged GaAsFETs typically have a considerable source lead parasitic inductance. By choosing a decoupling capacitor, or capacitors, with a value that resonates with the source lead inductance, the true FET source impedance to a circuit ground is further reduced.

Therefore, the package, or lead, inductance of the capacitor, or capacitors, should be considered in the equation for resonance when selecting a capacitor to resonate with the GaAsFET source lead inductance. Additionally, several parallel capacitors with a combined reactance that resonates with the GaAsFET source lead inductance are selected to minimize the decoupling capacitor ESR and maximize efficiency in high power rf applications (FET rf output in excess of 2 Watts).

Summarizing, the selection of decoupling capacitors is critical, especially for high-power rf amplifiers. Decoupling capacitors, such as the decoupling capacitors C5, C6, C8, C10, C14, and C16, are selected for both resonant frequencies at or very near the circuit-operating frequency and for the lowest possible effective (or equivalent) series resistances (ESRs).

Referring again to FIG. 20, two or more capacitors, each with self-resonant frequencies at or near the amplifier-operating frequency, are connected in parallel between the FET source terminal and a circuit ground, or electrical ground, to achieve an ESR that is sufficiently low for high-power rf amplifiers of the type shown and described herein.

For narrow-band operation, if a capacitor is not available with a resonant frequency that closely matches an operating frequency, two or more paralleled capacitors are chosen that have resonant frequencies both above and below the operating frequency. For broad-band operation, multiple decoupling capacitors with self-resonant frequencies selected at several points in the operating-frequency band are selected for minimum ESR across the broad-frequency band.

Often in high power packaged FETs the source terminal is the body of the device and is connected to a mounting flange. Conventionally, the flange is connected directly to a circuit ground with metallic screws to achieve minimal rf impedance to an electrical ground and to maximize thermal conductivity between the FET and a circuit ground, which is most often a chassis serving as a heat sink to the FET. However, in the present invention, the source terminals of the FETs are electrically isolated from a circuit ground.

Figure 21:
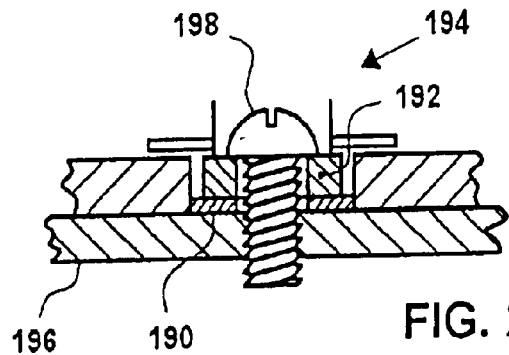
FIG. 21 is a side elevation, in partial cross section, of a high-power rf FET that is mounted to achieve maximum thermal conduction while maintaining electrical isolation of the source terminal from electrical ground.

Referring now to FIG. 21, a thermally conductive, electrically insulating pad 190 is inserted between a FET mounting flange 192 of a FET 194 and a heat sink, or chassis, 196 to allow the dissipated heat of the FET 194 to flow from the FET 194 to the heat sink 196 while maintaining electrical isolation. The electrical insulating material of the pad 190 should have no higher than 0.5° C./Watt thermal resistance. An insulating material with a higher thermal resistance, combined with the thermal resistance of the FET 194 and the ambient temperature, may result in the internal junction temperature of the FET 194 being excessive, thereby causing reduced reliability or destruction of the FET 194.

A suitable material for the insulating pad 190 is *DeltaPad Thermally Conductive Insulator*, Part Number 174–9 Series, manufactured by Wakefield Engineering of Pelham, N.H. The material for the insulating pad 190 is 0.22 millimeters (0.009 inches) thick, has a thermal resistance of 0.25° C./W, a resistivity of $10^{13}$ megohms per cubic centimeter of volume, and a 5000 volt breakdown.

The mounting flange 192 is held in heat-conducting contact with the insulating pad 190 and with the heat sink 196, with non-ferrous, or non-conductive, screws 198. The tensile strength and stretching of the screw material along with the manufacturer-recommended FET mounting torque must be taken into account when selecting fasteners.

Figure 22:
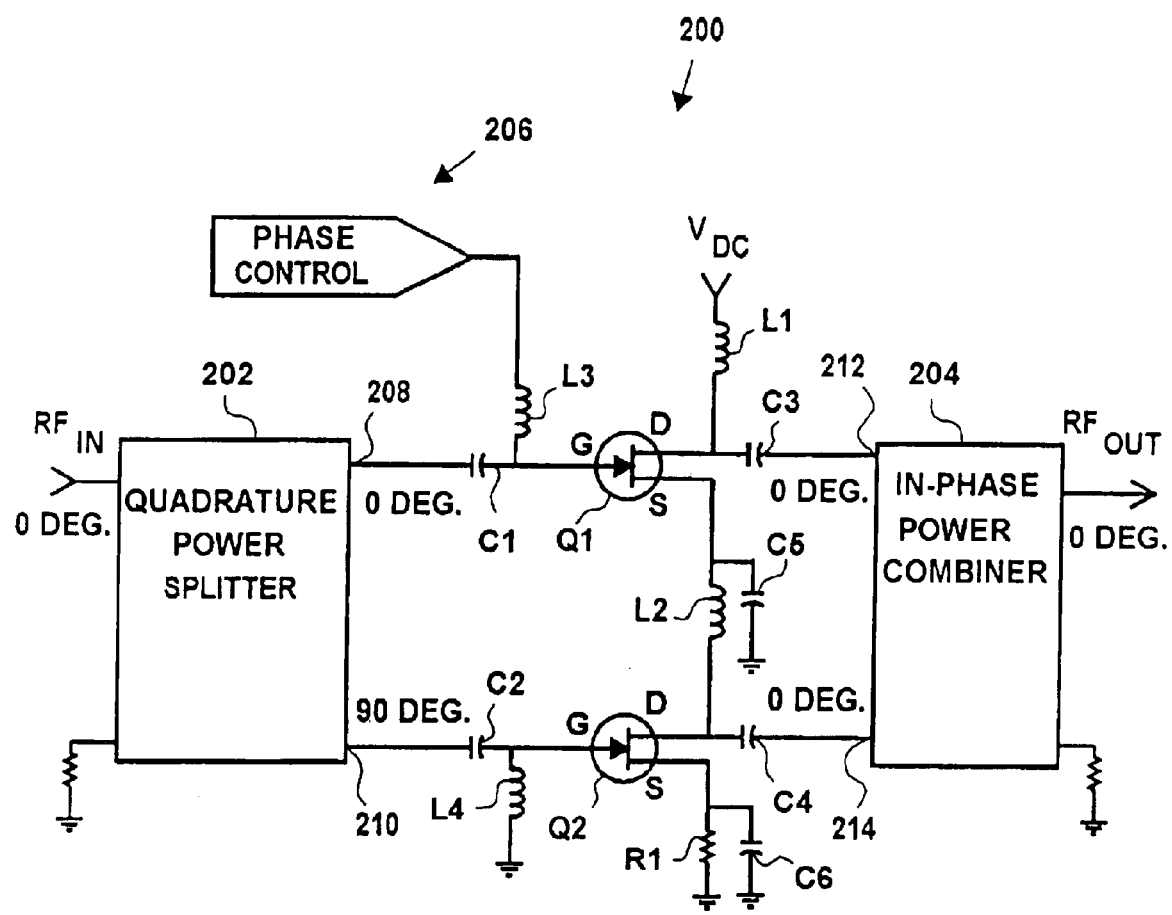
FIG. 22 is an rf power amplifier in which two gallium arsenide FETS are stacked to divide the dc supply voltage, and the rf output is variably phase shifted.

Referring now to FIG. 22, a variable phase-shifting rf amplifier 200 includes like-named and like-numbered components as those in FIG. 1, except that the power splitter 12 of FIG. 1 has been replaced by a quadrature power splitter 202, the power combiner 14 has been replaced by an in-phase power combiner 204, and the fixed voltage divider FD1 has been replaced by a phase control 206. The phase control 206 illustrates a selectively variable gate voltage for the FET Q1 that may be provided from any suitable source.

The voltage to the drain terminal, D, of the upper FET Q1 cannot exceed the specified FET drain-to-source voltage (Vds). Or, if the FET Q1 were replaced by a bipolar transistor, not shown, the collector-to-emitter voltage (Vce) could not exceed specifications. Therefore in the case of GaAsFETs Q1 and Q2, the supply voltage should be 12 volts dc (Vds+Vpinchoff of the lower FET Q2).

If the phase control voltage is lowered to 0.0 volts dc by the phase control 206, 10.0 volts dc will be applied across the FET Q1, and 0.0 volts dc will be applied across the FET Q2. Since the gain of FETs, such as the GaAsFETs, Q1 and Q2, is approximately a linear function of the drain-to-source voltage, an rf output of the FET Q1 will be at maximum gain while an rf output of the FET Q2 will be at minimum.

The in-phase combiner 204 will output half of the rf power to the rf output $RF_{OUT}$ terminal and half of the rf power to the internal or external load. More importantly, the half delivered to the rf output $RF_{OUT}$ terminal will be in-phase with an upper terminal 208 of the quadrature power splitter 202.

If the phase control voltage is now raised to 10.0 volts dc by the phase control 206, 0.0 volts dc will be applied across the FET Q1, and 10.0 volts dc will be applied across the FET Q2. The FET Q1 will now be at a minimum gain while the FET Q2 will be at maximum. In this case the output of the in-phase power combiner 204 will be in phase with a lower terminal 210 of the quadrature power splitter 202. That is, the phase will have been shifted 90 degrees. Again, half of the power is delivered to the rf output $RF_{OUT}$ and half is delivered to the internal or external load.

If the phase control voltage is set to 5.0 volts dc by the phase control 206, 5.0 volts dc will be applied across both the FET Q1 and the FET Q2, and both FETs will operate at half gain. In this case an upper input terminal 212 and a lower input terminal 214 to the in-phase power combiner 204 will be equal in amplitude but 90 degrees out of phase.

At this time, the rf output $RF_{OUT}$ of the in-phase combiner 204 remains at half power but is 45 degrees out of phase with the upper input terminal 212. As before, half of the power will be delivered to the internal or external load.

Thus it can be seen that phase control 206 is effective to shift the phase of the rf amplifier 200 monotonically, and with reasonable linearly, from 0 to 90 degrees as the phase control voltage is varied from 0 volts dc to 10 volts dc.

Finally, while FIG. 22 illustrates a preferred embodiment, alternately, instead of the quadrature power splitter 202 and the in-phase power combiner 204, an in-phase splitter and a quadrature combiner may be used.

Figure 23:
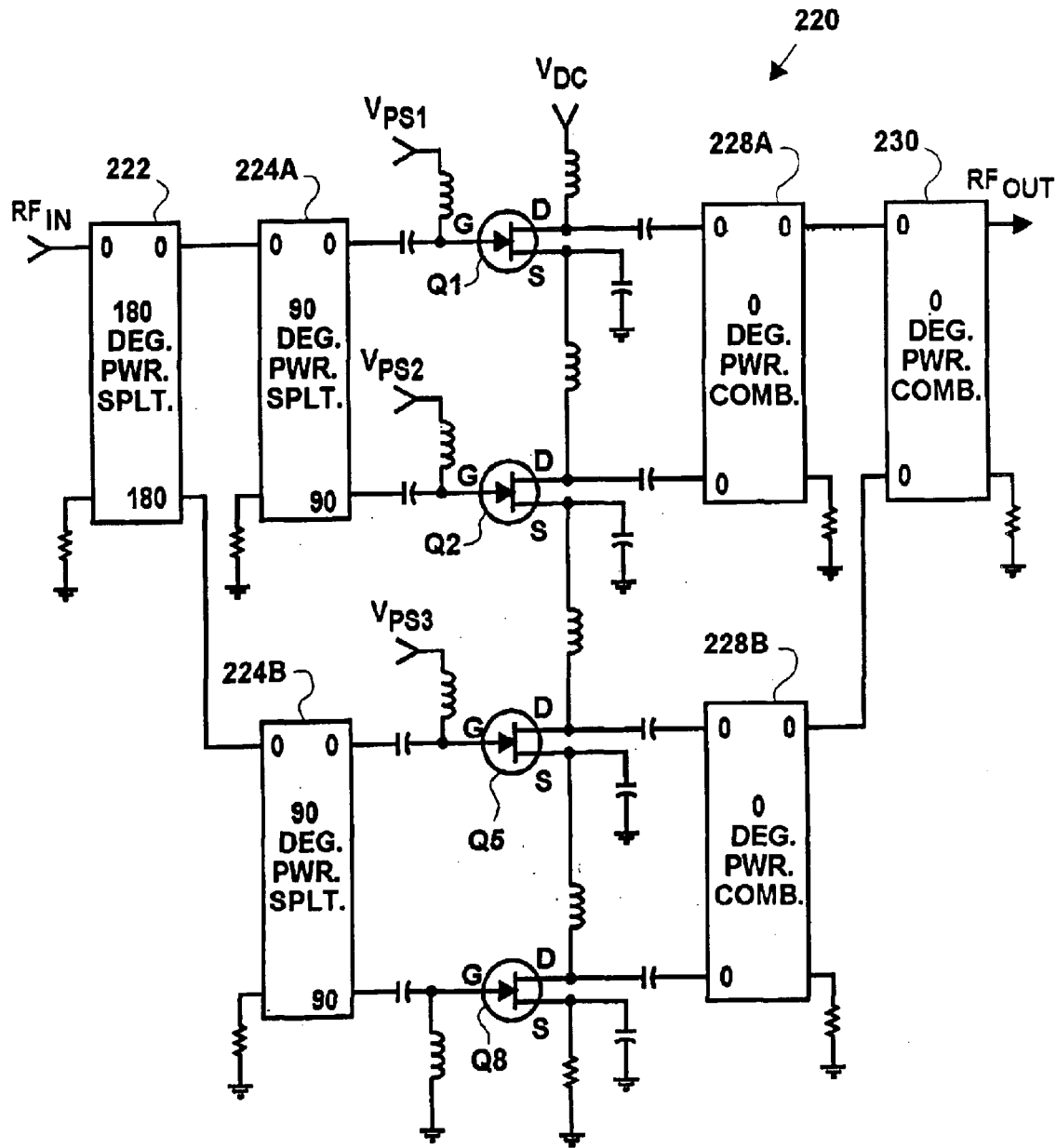
FIG. 23 is an rf power amplifier, similar to that of FIG. 22, except that a 180 degree power splitter, two 90 degree splitters, four FETs, and three 0 power combiners are used to achieve variable phase shifting up to 270 degrees.

Referring now to FIG. 23, a variable phase-shifting rf amplifier 220 has a wider phase range than the variable phase-shifting rf amplifier 200 of FIG. 22. The variable phase-shifting rf amplifier 220 includes a 180 degree power splitter 222, 90 degree power splitters 224A and 224B, solid-state current devices, or GaAsFETs, Q1, Q2, Q5, and Q8, 0 degree power combiners 228A and 228B, and a 0 degree power combiner 230. In addition, the variable phase-shifting rf amplifier 220 includes coupling capacitors, decoupling capacitors, and rf chokes as shown in FIG. 22, and as taught in conjunction with various ones of the preceding embodiments.

If phase-shifting voltages $V_{PS1}$, $V_{PS2}$, and $V_{PS3}$ are all set to 0.0 volts dc, 10.0 volts dc will appear across the FET Q1 and 0.0 volts dc will appear across the FETs Q2, Q5, and Q8. Since the gain of the FETs, Q1, Q2, Q5, and Q8 is approximately a linear function of the applied voltage from drain to source, the FET Q1 will be at maximum gain while the FETS Q2, Q5, and Q8 will be at minimum. The rf output $RF_{OUT}$ will then be at 0 degrees (disregarding the inversion of the FET Q1) relative to the rf input $RF_{IN}$.

If the phase-shifting voltage $V_{PS1}$ is now raised to 10.0 volts dc and the phase-shifting voltages $V_{PS2}$ and $V_{PS3}$ remain at 0.0 volts dc, 10.0 volts dc will appear across the FET Q2, and 0.0 volts dc will appear across the FETS Q1, Q5, and Q8. The FET Q2 will now be at maximum gain while the FETS Q1, Q5, and Q8 will be at minimum. In this case the rf output $RF_{OUT}$ will be at 90 degrees relative to the rf input $RF_{IN}$ (again disregarding the inversion of the FET Q2).

Similarly to FIG. 22, if the phase-shifting voltage $V_{PS1}$ is at 5.0 volts dc, and the phase-shifting voltages $V_{PS2}$ and $V_{PS3}$ are at 0.0 volts dc, the rf output $RF_{OUT}$ will be at 45 degrees relative to the rf input $RF_{IN}$. By proper application of the phase-shifting voltages $V_{PS1}$, $V_{PS2}$, and $V_{PS3}$, the phase of the variable phase-shifting rf amplifier 220 can be made to vary monotonically and reasonably linearly from 0 degrees to 270 degrees.

Finally, these concepts can be extended to even wider phase control by applying the principles set forth in conjunction with FIG. 23. Optionally, the splitters and combiners can be at phase angles other than 0 degrees, 90 degrees, and 180 degrees.

Although the preceding discussion has focused on use of GaAsFETs in totem-pole circuit at microwave frequencies for frequencies of 3 Ghz, or higher, there are also efficiency advantages to using the totem-pole circuit at lower frequencies, such as the "L" and "S" bands (1 to 3 Ghz).

At these lower frequencies, silicon bipolar transistors operated in Class C are the most commonly used amplification device. However, GaAsFETs, in totem-pole arrangement, provide an improvement in amplifier efficiency over that achieved by the use of silicon bipolar transistor amplifiers.

There are two basic reasons for this improvement in efficiency. First, the GaAsFETs, with efficiencies up to seventy percent, are inherently more efficient than silicon bipolar transistors at "L" and "S" bands. Second, the high gain of GaAsFETs at "L" and "S" bands (up to 20 Db) versus silicon bipolar transistors (about 10 Db) result in fewer total amplification stages to achieve the desired rf power output.

Therefore, the use of GaAsFETs at these lower frequencies results in the elimination of stage(s) and allows for lower power driver stages. And the high gain of the GaAsFETs makes the power-added efficiency (PAE) higher than that of traditional Class C silicon bipolar transistors despite the Class A or A/B operation of the GaAsFET.

While GaAsFETs have been shown and described, it should be understood that the principles taught herein may be applied to other types of solid-state current devices.

In summary, the present invention can be characterized as providing rf power amplifiers, both constant and variable power, in which at least two solid state current devices, which preferably are gallium arsenide field-effect transistors (GaAsFETs), dividingly share the supply voltage, and share the same current.

Thus, the amplifiers of the present invention can be characterized as permitting use of linear regulators with significantly less voltage drop over the pass element, thereby providing distinct advantages over the prior art practice of using either a linear regulator with a high voltage drop over the pass element, or alternately, a switching regulator.

Further, the present invention provides rf power amplifiers, both fixed and variable, in which a single rf output is produced, in which two or more rf outputs are produced, or in which two or more rf outputs may be variably phase shifted.

More succinctly, the present invention can be characterized as connecting a plurality of field-effect devices in series for dc operation while the same devices operate in parallel for rf operation. Additionally, the present invention provides a method for minimizing the rf impedance from a field-effect device source to a circuit ground, thereby maximizing dc-rf conversion efficiency while minimizing interference between field-effect devices, and between field-effect devices and power supply, by design and selection of decoupling capacitors and rf chokes.

Finally, the selection of decoupling capacitors is critical for rf amplifiers of the type taught herein, especially for high-power rf amplifiers. Therefore, the present invention can be characterized as providing rf decoupling in which decoupling capacitors resonate at operating frequencies, have the lowest possible ESRs, are paralleled in any number to lower the ESRs to necessary values for a given rf power, are paralleled on opposite sides of an operating frequency for narrow-bandwidth operation if capacitances are not available that will resonate at the operating frequency, and are paralleled across a bandwidth for broad-band operation in any numbers and at any resonant frequencies that will provide, across the bandwidth, ESRs that are sufficiently low to provide high reliability and low power losses for a given rf output power.

U.S. Pat. No. US 6,683,499 B2, which issued Jan. 27, 2004, is incorporated herein by reference thereto.

While specific apparatus and method have been disclosed in the preceding description, it should be understood that these specifics have been given for the purpose of disclosing the principles of the present invention, and that many variations thereof will become apparent to those who are versed in the art. Therefore, the scope of the present invention is to be determined by claims included herein without any limitation by numbers that may be parenthetically inserted in the claims.

What is claimed is:

1. A method for rf power amplifying which comprises:
   a) series connecting upper and lower solid-state current devices;
   b) said series connecting step comprises connecting a lower-voltage terminal of said upper solid-state current device to an rf choke, and connecting said rf choke to a higher-voltage terminal of said lower solid-state current device;
   c) separately amplifying rf signals in said solid-state current devices at a selected operating frequency;
   d) rf decoupling said solid-state current devices;
   e) said rf decoupling step comprises providing a capacitance between said lower-voltage terminal and an electrical ground; and
   f) said rf decoupling step further comprises making an rf effective series resistance of said capacitance lower than that of any porcelain capacitor that resonates at said selected operating frequency.

2. A method as claimed in claim 1 in which said step of making an rf effective series resistance lower than that of any porcelain capacitor comprises making two capacitors function as parallel-connected capacitors.

3. A method as claimed in claim 1 in which said method further comprises:
   a) splitting an rf input into said rf signals prior to said separate amplifying step; and
   b) combining said separately amplified rf signals.

4. A method as claimed in claim 2 in which said rf decoupling step further comprises selecting two of said capacitors to resonate at substantially the same frequency.

5. A method as claimed in claim 2 in which said rf decoupling step further comprises:
   a) selecting one of said capacitors to resonate at a frequency that is higher than said selected operating frequency; and
   b) selecting an other of said capacitors to resonate at a frequency that is lower than said selected operating frequency.

6. A method as claimed in claim 2 in which said rf decoupling step further comprises:
   a) selecting two of said capacitors to resonate at frequencies that are higher than said selected operating frequency; and
   b) selecting an other two of said capacitors to resonate at frequencies that are lower than said selected operating frequency.

7. A method as claimed in claim 2 in which said rf decoupling step further comprises:
   a) selecting two of said capacitors to resonate at separate frequencies that are both higher than said selected operating frequency; and
   b) selecting an other two of said capacitors to resonate at separate frequencies that are both lower than said selected operating frequency.

8. A method as claimed in claim 2 in which:
   a) said method further comprises disposing said selected operating frequency within a broad band of operating frequencies;
   b) said rf decoupling step further comprises selecting a first plurality of said capacitors to resonate in a higher-frequency portion of said broad band; and
   c) said rf decoupling step still further comprises selecting a second plurality of said capacitors to resonate in a lower-frequency portion of said broad band.

9. A method as claimed in claim 1 in which:
   a) said method further comprises disposing said selected operrating frequency within a broad band of operating frequencies;
   b) said rf decoupling step further comprises making an rf effective series resistance of said capacitance lower than that of any porcelain capacitor that resonates in a higher-frequency of said broad band; and
   c) said rf decoupling step still further comprises making an rf effective series resistance of an other capacitance lower than that of any porcelain capacitor that resonates in a lower-frequency of said broad band.

10. A method as claimed in claim 1 in which:
    a) said method for rf power amplifying further comprises series connecting a third solid-state current device with said upper and lower solid-state current devices;
    b) said method further comprises supplying a variable voltage to a control terminal of said third solid-state current device; and
    c) said method still further comprises controlling an rf output of one of said amplified rf signals as a function of said variable voltage.

11. A method as claimed in claim 1 in which:
    a) said separate amplifying step comprises rf amplifying one of said rf signals at varying frequencies; and
    b) said method comprises flattening an rf output of one of said amplified rf signals with respect to said varying frequencies.

12. A method as claimed in claim 1 in which:
    a) said method comprises series connecting a third solid-state current device with said upper and lower solid-state current devices;
    b) said separate amplifying step comprises amplifying said rf signals at equal and varying frequendes;
    c) said method further comprises combining said separately amplified rf signals into a single rf output;
    d) said method still further comprises flattening said single rf output with respect to said varying frequencies; and
    e) said flattening step comprises detecting said single rf output, using said detected rf output to control said third solid-state current device, and using said third solid-state current device to control said separate amplifying steps.

13. A method as claimed in claim 1 in which:
    a) said method comprises series connecting a third solid-state current device with said upper and lower solid-state current devices;
    b) increasing current flow through two of said solid-state current devices with respect to said current flow through an other of said solid-state current devices; and
    c) said increasing step comprises shunting current flow around said other solid-state current device.

14. A method as claimed in claim 1 in which said method comprises:

a) series connecting a third solid-state current device with said upper and lower solid-state current devices;

b) amplifying an rf input in said third solid-state current device; and c) splitting said amplified rf input into said rf signals.

15. A method as claimed in claim 1 in which said method comprises:

a) series connecting third and fourth solid-state current devices with said upper and lower solid-state current devices;

b) amplifying an rf input in said third solid-state current device;

c) splitting said amplified rf input into said rf signals;

d) supplying a variable voltage to a control terminal of said third solid-state current device; arid e) controlling power amplification of said upper and lower solid-state current devices as a function of said variable voltage.

16. A method as claimed in claim 1 in which said method comprises:

a) connecting third and fourth solid-state current devices in parallel; and b) connecting said parallel-connected third and fourth solid-state current devices in series with said upper and lower solid-state current devices.

17. A method as claimed in claim 1 in which said method comprises:

a) connecting third and fourth solid-state current devices in parallel;

b) connecting said parallel-connected third and fourth solid-state current devices in series with said upper and lower solid-state current devices;

c) amplifying an rf input in said third solid-state current device;

d) splitting said amplified rf input into said rf signals;

e) delivering a variable control voltage to said fourth solid-state current device; and f) controlling said separate amplifying steps as a function of said variable control voltage.

18. A method as claimed in claim 1 in which:

a) said method comprises splitting an rf input into said rf signals; and b) said separate amplifying steps comprise producing separate rf outputs.

19. A method as claimed in claim 1 in which:

a) said method comprises splitting an rf input into said rf signals;

b) said separate amplifying steps comprise producing separate rf outputs; and c) said method further comprises separately phase-shifting one of said separate rf outputs.

20. A method as claimed in claim 1 in which said method further comprises:

a) splitting an rf input into said rf signals and a third rf signal; and b) separately amplifying said third rf signal.

21. A method as claimed in claim 1 in which said method further comprises:

a) splitting an rf input into said rf signals and a third rf signal;

b) separately amplifying said third rf signal; and c) combining all of said separately amplified rf signals.

22. A method as claimed in claim 1 in which:

a) said method comprises series connecting a third solid-state current device with said upper and lower solid-state current devices;

b) supplying a variable-voltage input to said third solid-state current device;

c) producing a variable-frequency rf signal in said third solid-state current device that is a function of said variable-voltage input; and d) splitting said variable-frequency rf signal into said rf signals.

23. A method as claimed in claim 1 in which said method comprises paralleling a third solid-slate current device with one of said series-connected solid-state current devices.

24. A method as claimed in claim 1 in which:

a) said method further comprises rf decoupling a lower-voltage terminal of said lower solid-state current device; and b) said rf decoupling step comprises making an rf effective series resistance between said lower-voltage terminal and said electrical ground lower than that of any porcelain capacitor that resonates at said selected operating frequency.

25. A method as claimed in claim 1 in which:

a) said method further comprises rf decoupling a lower-volyage terminal of said lower solid-state current device;

b) said rf decoupling step comprises making an rf effective series resistance between said lower-voltage terminal and said electrical round lower than that of any porcelain capacitor that resonates at said selected perating frequency; and c) said step of making an rf effective series resistance lower than that of any porcelain capacitor comprises making two capacitors function parallel-connected capacitors.

* * * * *